US012650643B2

(12) United States Patent
Youn et al.

(10) Patent No.: US 12,650,643 B2
(45) **Date of Patent: *Jun. 9, 2026**

(54) COMPOSITION INCLUDING QUANTUM DOT, MANUFACTURING METHOD QUANTUM DOT AND COLOR FILTER

(71) Applicant: SAMSUNG SDI CO., LTD., Yongin-si (KR)

(72) Inventors: Jinsuop Youn, Suwon-si (KR); Misun Kim, Suwon-si (KR); Hong Jeong Yu, Suwon-si (KR); Bumjin Lee, Suwon-si (KR); Yonghee Kang, Suwon-si (KR); Dongjun Kim, Suwon-si (KR); Byeonggeun Son, Suwon-si (KR); Jihyeon Yim, Suwon-si (KR); Mi Jeong Choi, Suwon-si (KR); Jonggi Kim, Suwon-si (KR); Minjee Park, Suwon-si (KR); Hojeong Paek, Suwon-si (KR); Woo Jung Shin, Suwon-si (KR); Young Woong Jang, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 41 days.

This patent is subject to a terminal disclaimer.

(21) Appl. No.: 18/446,373

(22) Filed: Aug. 8, 2023

(65) Prior Publication Data

US 2024/0027906 A1 Jan. 25, 2024

Related U.S. Application Data

(62) Division of application No. 16/155,691, filed on Oct. 9, 2018, now Pat. No. 11,762,289.

(30) Foreign Application Priority Data

Oct. 27, 2017 (KR) ........................ 10-2017-0141376
Feb. 27, 2018 (KR) ........................ 10-2018-0023867

(51) Int. Cl.

| | |
|---|---|
| ***G03F 7/004*** | (2006.01) |
| ***B82Y 20/00*** | (2011.01) |
| ***B82Y 30/00*** | (2011.01) |
| ***B82Y 35/00*** | (2011.01) |
| ***C09K 11/02*** | (2006.01) |
| ***C09K 11/88*** | (2006.01) |
| ***G03F 7/00*** | (2006.01) |
| ***G03F 7/027*** | (2006.01) |
| ***G03F 7/031*** | (2006.01) |
| ***G03F 7/033*** | (2006.01) |
| ***G03F 7/038*** | (2006.01) |

(52) U.S. Cl.

CPC .......... *G03F 7/0048* (2013.01); *C09K 11/025* (2013.01); *C09K 11/883* (2013.01); *G03F 7/0007* (2013.01); *G03F 7/027* (2013.01); *G03F 7/031* (2013.01); *G03F 7/033* (2013.01); *G03F 7/038* (2013.01); *B82Y 20/00* (2013.01); *B82Y 30/00* (2013.01); *B82Y 35/00* (2013.01)

(58) Field of Classification Search

CPC ..... C09K 11/03; C09K 11/883; G03F 7/0048; G03F 7/0007; G03F 7/027; G03F 7/031; G03F 7/038

See application file for complete search history.

(56) References Cited

U.S. PATENT DOCUMENTS 7,041,371 B2 5/2006 Ogura et al.
7,361,516 B2 4/2008 Uyeda et al.
(Continued)

FOREIGN PATENT DOCUMENTS

CN 101391756 A 3/2009
CN 102086396 A 6/2011
(Continued)

OTHER PUBLICATIONS

International Search Report for corresponding PCT International Application No. PCT/KR2020/012595 mailed Dec. 24, 2020, 4pp.
(Continued)

*Primary Examiner* — C Melissa Koslow
(74) *Attorney, Agent, or Firm* — Womble Bond Dickinson (US) LLP

(57) ABSTRACT

A photosensitive resin composition includes: (A) a binder resin; (B) a photopolymerizable monomer; (C) a photopolymerization initiator; (D) a quantum dot surface-modified with a compound having a thiol group at one terminal end and an alkoxy group, a cycloalkyl group, a carboxyl group, or a hydroxy group at the other terminal end; and (E) a solvent. A curable composition includes: (A') a resin; (B') a quantum dot surface-modified with a compound represented by Chemical Formula 1 or Chemical Formula 2; and (C') a solvent. A method of manufacturing the surface-modified quantum dot, and a color filter manufactured using the photosensitive resin composition or the curable composition are also disclosed.

Chemical Formula 1

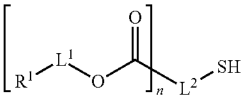

Chemical Formula 2

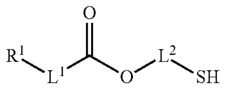

17 Claims, 2 Drawing Sheets

(56) References Cited

U.S. PATENT DOCUMENTS 7,648,843 B2 1/2010 Uyeda et al.
7,794,917 B2 9/2010 Mori et al.
8,741,177 B2 6/2014 Pickett et al.
8,889,429 B2 11/2014 Cao et al.
9,263,639 B2 2/2016 Aoki et al.
9,446,152 B2 9/2016 Mattoussi et al.
10,988,685 B2 4/2021 Ahn et al.
11,912,911 B2 2/2024 Kang et al.
12,331,234 B2 * 6/2025 Kim ...................... G03F 7/2018
2001/0023078 A1 9/2001 Bawendi et al.
2004/0007169 A1 1/2004 Ohtsu et al.
2009/0212258 A1 8/2009 McCairn et al.
2012/0041142 A1 2/2012 Nennemann et al.
2013/0345458 A1 12/2013 Freeman et al.
2014/0192396 A1 7/2014 Schram et al.
2014/0264196 A1 9/2014 Werner et al.
2014/0275431 A1 9/2014 Freeman et al.
2015/0267106 A1 9/2015 Pillay Narrainen et al.
2016/0011506 A1 * 1/2016 Gu .......................... G03F 7/029 430/281.1
2016/0289552 A1 10/2016 Werner et al.
2018/0102449 A1 4/2018 Pschenitzka
2018/0142149 A1 5/2018 Youn et al.
2018/0149974 A1 5/2018 Kim et al.
2018/0179441 A1 6/2018 Park et al.
2018/0354222 A1 12/2018 Calabrese et al.
2018/0354244 A1 12/2018 Jen-La Plante et al.
2018/0355244 A1 12/2018 Lüchinger et al.
2019/0011782 A1 1/2019 Pickett et al.
2019/0077954 A1 3/2019 Tangirala et al.
2019/0129302 A1 5/2019 Youn et al.
2019/0278177 A1 9/2019 Jeong et al.
2020/0248068 A1 8/2020 Choi et al.
2020/0264461 A1 8/2020 Kuwana et al.
2020/0317998 A1 10/2020 Nojima
2022/0213380 A1 7/2022 Kang et al.

FOREIGN PATENT DOCUMENTS

CN 102277158 A 12/2011
CN 102517025 A 6/2012
CN 103896776 A 7/2014
CN 105070849 A 11/2015
CN 105131712 A 12/2015
CN 105189584 A 12/2015
CN 105247010 A 1/2016
CN 106206972 A 12/2016
CN 106468856 A 3/2017
CN 106863935 A 6/2017
CN 106957645 A 7/2017
CN 107722184 A 2/2018
CN 108102640 A 6/2018
CN 108107679 A 6/2018
CN 108219771 A 6/2018
CN 108445713 A 8/2018
CN 108445715 A 8/2018
CN 109476989 A 3/2019
CN 109749733 A 5/2019
CN 109952359 A 6/2019
CN 109994619 A 7/2019
CN 110205111 A 9/2019
CN 110297391 A 10/2019
EP 2105793 B1 5/2016
JP 05-072723 A 3/1993
JP 2002-121548 A 4/2002
JP 2002-121549 A 4/2002
JP 2003-137912 A 5/2003
JP 2009-132771 A 6/2009
JP 2010-118434 A 5/2010
JP 2011-122033 A 6/2011
JP 2016-98375 A 5/2016
JP 2016-519175 A 6/2016
JP 2017-32918 A 2/2017
JP 6093179 B2 3/2017
JP 2017-106006 A 6/2017
JP 2017-137451 A 8/2017
JP 6236412 B2 11/2017
JP 2018-84823 A 5/2018
JP 2018-91924 A 6/2018
JP 2018-131613 A 8/2018
JP 2018-153915 A 10/2018
JP 2019-85568 A 6/2019
JP 2020-41080 A 3/2020
JP 2020-105491 A 7/2020
JP 2020-118971 8/2020
JP 2021-501230 A 1/2021
KR 1992-7002502 A 9/1992
KR 1994-0005617 B1 6/1994
KR 1995-7000359 A 1/1995
KR 1995-0011163 B1 9/1995
KR 10-2009-0078099 A 7/2009
KR 10-2010-0138925 A 12/2010
KR 10-2014-0072682 A 6/2014
KR 10-2015-0023849 A 3/2015
KR 10-2015-0052759 A 5/2015
KR 10-2015-0098691 A 8/2015
KR 10-2016-0022158 A 2/2016
KR 10-2016-0097445 A 8/2016
KR 10-2016-0114292 A 10/2016
KR 10-2016-0119149 A 10/2016
KR 10-2016-0135763 A 11/2016
KR 10-2016-0142100 A 12/2016
KR 10-2017-0006024 A 1/2017
KR 10-2017-0022951 A 3/2017
KR 10-2017-0028306 A 3/2017
KR 10-2017-0035688 A 3/2017
KR 10-2017-0047125 A 5/2017
KR 10-2017-0060400 A 6/2017
KR 10-2017-0073249 A 6/2017
KR 10-2017-0075478 A 7/2017
KR 10-2017-0101002 A 9/2017
KR 10-2017-0106048 A 9/2017
KR 10-2017-0106791 A 9/2017
KR 10-2017-0141005 A 12/2017
KR 10-2018-0025248 A 3/2018
KR 10-2018-0027617 A 3/2018
KR 10-1839700 B1 3/2018
KR 10-2018-0059363 A 6/2018
KR 10-2018-0059724 A 6/2018
KR 10-2018-0080507 A 7/2018
KR 10-2018-0092671 A 8/2018
KR 10-2018-0106125 A 10/2018
KR 10-2018-0111082 A 10/2018
KR 10-1895909 B1 10/2018
KR 10-1909541 B1 10/2018
KR 10-2019-0004536 A 1/2019
KR 10-2019-0007069 A 1/2019
KR 10-2019-0047573 A 5/2019
KR 10-1971586 B1 6/2019
KR 10-2019-0095070 A 8/2019
KR 10-2019-0102857 A 9/2019
KR 10-2019-0108366 A 9/2019
KR 10-2019-0110935 A 10/2019
KR 10-2019-0112631 A 10/2019
KR 10-2020-0041937 A 4/2020
KR 10-2020-0060430 A 5/2020
KR 10-2226069 B1 3/2021
KR 10-2296792 B1 8/2021
TW 201213452 A1 4/2012
TW 201239044 A1 10/2012
TW 201243002 A1 11/2012
TW 201634604 A 10/2016
TW 201643221 A 12/2016
TW 201730671 A 9/2017
TW 201809216 A 3/2018
TW 201825648 A 7/2018
TW 201835298 A 10/2018
TW 201835652 A 10/2018
TW 201920612 A 6/2019
TW 201923461 A 6/2019
TW 201925420 A 7/2019
WO WO 2000/017656 A1 3/2000
WO WO 2005/093422 A2 10/2005

| | | | |
|---|---|---|---|
| WO | WO 2010/039897 A2 | 4/2010 |
| WO | WO 2017/002833 | 1/2017 |
| WO | WO 2017/008442 A1 | 1/2017 |
| WO | WO 2017/019789 A1 | 2/2017 |
| WO | WO 2017/150112 A1 | 9/2017 |
| WO | WO 2018/051961 A1 | 3/2018 |
| WO | WO 2018/071308 A1 | 4/2018 |
| WO | WO 2018/105545 A1 | 6/2018 |
| WO | WO 2018/226925 A1 | 12/2018 |
| WO | WO 2019/008374 A1 | 1/2019 |
| WO | WO 2019/030680 A1 | 2/2019 |
| WO | WO 2019/072882 A1 | 4/2019 |
| WO | WO 2019/084119 A1 | 5/2019 |
| WO | WO 2019/111617 A1 | 6/2019 |
| WO | WO 2019-167751 A | 9/2019 |

OTHER PUBLICATIONS

Varga, Krisztina et al.; "CdSe Quantum Dots Functionalized with Chiral, Thiol-Free Carboxylic Acids: Unraveling Structural Requirements for Ligand-Induced Chirality"; ACS Nano 2017; 11; pp. 9846-9853.
Chinese Search Report dated Jun. 9, 2023, issued in Chinese Patent Application No. 202080048082.0 (3 pages).
Chinese Office Action dated Jun. 16, 2023, issued in Chinese Patent Application No. 202010036364.0 (8 pages).
Taiwanese Patent Office Action and Search Report for Taiwanese App. No. 109101173, dated Jul. 23, 2020, 14 pages.
Yoon, Cheolsang, et al., "High luminescence efficiency white light emitting diodes based on surface functionalized quantum dots dispersed in polymer matrices," Colloids and Surfaces A: Physicochem. Eng. Aspects 428 (2013) 86-91. (Year: 2013).
US Office Action dated Aug. 4, 2023, issued in U.S. Appl. No. 16/742,855 (15 pages).
US Office Action dated May 19, 2023, issued in U.S. Appl. No. 16/742,857 (9 pages).
Chinese Search Report for corresponding CN Application No. 2020110385025, dated Jun. 14, 2023, 3 pages.
Taiwanese Office Action and Search Report, for corresponding TW Application No. 109132996, dated Jun. 9, 2021, 8 pages.
Taiwanese Office Action and Search Report, for the corresponding TW Patent Application No. 109132996, dated Mar. 28, 2022, 8 pages.
US Office Action dated Sep. 10, 2024, issued in U.S. Appl. No. 17/595,497 (7 pages).
US Office Action dated Jun. 14, 2024, issued in U.S. Appl. No. 18/516,818 (8 pages).
Chinese Office Action dated Jun. 20, 2024, issued in Chinese Patent Application No. 202010036364.0 (6 pages).
Beland, V. A. et al., "Antimony-functionalized phosphine-based photopolymer networks," Angewandte Chemie International Edition, vol. 57, Issue 40, 2018, 7 pages.
Beland, V.A. et al., "Antimony-functionalized phosphine-based photopolymer networks", Angew. Chem., 2018, vol. 130, pp. 13436-13440.
Breus, Vladimir V., et al., "Quenching of CdSe—ZnS Core-Shell Quantum Dot Luminescence by Water-Soluble Thiolated Ligands," J. Phys. Chem. C, 2007, pp. 18589-18594.
Chengbin, Mu, "Communication Optical Fiber and Cable Materials and Industry Development," 1st Edition, Tongji University Press, Jun. 2015, Abstract, 4 pages.
Chinese Notice of Allowance dated Oct. 21, 2022, issued in Chinese Patent Application No. 201880063935.0 (5 pages).
Chinese Office Action dated Dec. 1, 2021, issued in Chinese Patent Application No. 202010042364.1, 9 pages.
Chinese Office Action dated Jun. 13, 2022, issued in Chinese Patent Application No. 202010042364.1 (8 pages).
Chinese Office Action, Search Report, dated Feb. 25, 2023, issued in corresponding Chinese Patent Application No. 202010022282.0 (3 pages).
Decision for grant dated Dec. 21, 2021, of the corresponding Japanese Patent Application No. 2020-521309, 3pp.
Deng, Dawei et al.; "Forming highly fluorescent near-infrared emitting PbS quantum dots in water using glutathione as surface-modifying molecule"; Journal of Colloid and Interface Science; 367; 2012; pp. 234-240.
English Abstract for foreign reference KR 10-2019-0102857 A, 1 page.
English translation of Japanese Decision for Grant for JP Application No. JP 2020-521309 dated Dec. 21, 2021, 3 pages.
English translation of Japanese Office Action for JP Application No. JP 2020-521309, dated Apr. 27, 2021, 4 pages.
English translation of Japanese Office Action, for Patent Application No. 2020-006789, mailed Jan. 5, 2021, 3 pages.
English translation of Korean Intellectual Property Office Action for KR Application No. 10-2018-0023868 dated Jun. 1, 2020, 7 pages.
English translation of Korean Notice of Allowance for KR Application No. 10-2018-0023867 dated Apr. 21, 2021, 2 pages.
English translation of Korean Notification of Third Party Observations for KR Application No. 10-2021-0088862 dated Jan. 26, 2022, 2 pages.
English translation of Korean Office Action for KR Application No. 10-2018-0023867 dated Aug. 19, 2020, 6 pages.
English translation of Korean Office Action, for Patent Application No. 10-2019-0007594, mailed May 7, 2021, 11 pages.
English translation of Korean Office Action, for Patent Application No. 10-2019-0014094, mailed Feb. 28, 2021, 6 pages.
English translation of Korean Office Action, for Patent Application No. 10-2019-0047931, mailed Jul. 22, 2021, 5 pages.
Final Rejection for U.S. Appl. No. 16/742,875 dated Apr. 11, 2022, 13 pages.
International Search Report and Written Opinion of the International Searching Authority dated on Apr. 13, 2020, for International Application No. PCT/KR2020/000037, 7 pages.
International Search Report issued in corresponding International Application No. PCT/KR2018/006007, dated Sep. 4, 2018, 3 pages.
Japanese Notice of Allowance dated Feb. 21, 2023, issued in corresponding Japanese Patent Application No. 2021-121430 (3 pages).
Japanese Office Action dated Feb. 16, 2021, issued in Japanese Patent Application Appl. No. 2020-029726, 3 pages.
Japanese Office Action dated Jan. 5, 2021, issued in Japanese Patent Application No. 2020-006250, 4 pages.
Japanese Office Action, for Patent Application No. 2020-006789, mailed Sep. 28, 2021, 3 pages.
Japanese Office Action, for Patent Application No. 2020-006789, mailed Jan. 5, 2021, 3 pages.
Korean Notice of Allowance dated Jun. 18, 2021, issued in Korean Patent Application No. 10-2019-0014094, 2 pages.
Korean Notification of Third Party Observations, for Patent Application No. KR 10-2021-0088862, mailed Jan. 26, 2022, 2 pages.
Korean Office Action dated Aug. 19, 2020, issued in corresponding Korean Patent Application No. 10-2018-0023867 (6 pages).
Korean Office Action for KR Application No. 10-2019-0007594 dated May 28, 2022, 8 pages.
Korean Office Action, for Patent Application No. 10-2019-0007594, mailed May 7, 2021, 10 pages.
Korean Office Action, for Patent Application No. 10-2019-0014094, mailed Feb. 28, 2021, 6 pages.
Korean Office Action, for Patent Application No. 10-2019-0047931, mailed Jul. 22, 2021, 4 pages.
Korean Office Action, with English translation, dated Mar. 28, 2022 for Korean Patent Application No. 10-2019-0007594 (17 pages).
Li Hua, et al., "Research Progress in Synthesis and Application of Quantum Dots," Journal of Jilin Institute of Architecture & Civil Engineering, Dec. 2014, 4 pages.
Notice of Allowance for U.S. Appl. No. 16/742,861 dated Nov. 9, 2022, 10 pages.
Notice of Allowance for U.S. Appl. No. 16/742,875 dated Nov. 3, 2022, 7 pages.
Office Action (including a search report) dated Dec. 29, 2021, of the corresponding Chinese Patent Application No. 201880063935.0, 13pp.
Office Action for U.S. Appl. No. 16/742,855 dated Dec. 2, 2022, 15 pages.

Office Action for U.S. Appl. No. 16/742,861 dated Jul. 12, 2022, 9 pages.
Office Action for U.S. Appl. No. 16/742,875 dated Jul. 18, 2022, 10 pages.
Ping, He, "Decorative Materials," 1st Edition, Southeast University Press, 2nd printing, Aug. 2002, Abstract, 5 pages.
Restriction Requirement for U.S. Appl. No. 16/742,855 dated Aug. 19, 2022, 7 pages.
Restriction Requirement for U.S. Appl. No. 16/742,857 dated Nov. 9, 2022, 9 pages.
Restriction Requirement for U.S. Appl. No. 16/742,861 dated Apr. 28, 2022, 9 pages.
Study on the properties of QDs with different ligand structures, May 26, 2013, 80pp.
Taiwanese Office Action dated Dec. 2, 2020, issued in corresponding Taiwanese Patent Application No. 109101093, 6 pages.
Taiwanese Office Action dated Feb. 22, 2021, issued in Taiwanese Patent Application No. 109101173, 9 pages.
Taiwanese Office Action dated Sep. 9, 2019, for corresponding Taiwanese Patent Application No. 107135471 (9 pages).
Taiwanese Patent Office Action and Search Report for corresponding Taiwanese Patent Application No. 109101997, dated Jul. 23, 2020, 16 pages.
U.S. Office Action dated Dec. 14, 2021, issued in U.S. Appl. No. 16/742,875, 12 pages.
US Final Office Action dated Apr. 28, 2023, issued in U.S. Appl. No. 16/742,855 (18 pages).
Zhu, Huaping, et al., "Synthesis and Optical Properties of Thiol Functionalized CdSe/ZnS(Core/Shell) Quantum Dots by Ligand Exchange," Journal of Nanomaterials, 2014, 15 pages.
US Final Office Action dated Nov. 29, 2023, issued in U.S. Appl. No. 16/742,855 (17 pages).
Chinese Notice of Allowance dated Jan. 5, 2024, issued in Chinese Patent Application No. 202010022282.0 (4 pages).

* cited by examiner

COMPOSITION INCLUDING QUANTUM DOT, MANUFACTURING METHOD QUANTUM DOT AND COLOR FILTER

CROSS-REFERENCE TO RELATED APPLICATIONS

This application is a divisional of U.S. patent application Ser. No. 16/155,691, filed Oct. 9, 2018, now U.S. Pat. No. 11,762,289, which claims priority to and the benefit of Korean Patent Application Nos. 10-2017-0141376 and 10-2018-0023867 filed in the Korean Intellectual Property Office on Oct. 27, 2017 and Feb. 27, 2018, respectively, the entire contents of each of which are incorporated herein by reference.

BACKGROUND

1. Field

This disclosure relates to a composition including a surface-modified quantum dot, a method of manufacturing the surface-modified quantum dot, and a color filter manufactured by using the composition. In addition, the composition according to this disclosure may be applied to a thermal curing process such as an inkjet process as well as a lithographic process, and thus, a composition including a surface-modified quantum dot according to embodiments of the present disclosure has a wide range of processability.

2. Description of the Related Art

In general, a color filter applied to a display is formed by using a photosensitive resist composition, forming a desired pattern through an exposure process by using a photomask, and then, dissolving and removing a non-exposed region through a development process. A material for the color filter may be desired or required to have properties of alkali-solubility, high sensitivity, adherence to a substrate, chemical resistance, heat resistance, and the like. However, the material for the color filter in general is not suitably or sufficiently cured through the exposure and thus should be thermally cured through a heat treatment at a high temperature of greater than or equal to 200° C. in order to obtain suitable or required characteristics. Accordingly, the material for the color filter has a limit in being applied to electronic paper, OLED, and the like that are formed using a low temperature process.

On the other hand, an attempt to complement the unsuitable or insufficient curing characteristics by adding a compound, for example, epoxide, peroxide, and the like thereto to develop a photosensitive resin composition for a color filter using a relatively low temperature process for the electronic paper, the OLED, and the like has been made but does not secure suitable or sufficient curing and thus has a problem of low reliability.

The problem occurs, since a color material such as a pigment, a dye, or the like competitively absorbs light energy with a photopolymerization initiator, and in addition, the photosensitive resin composition may not have suitable or sufficient initiation efficiency and accordingly, show a lower curing rate of a photopolymerizable monomer than one not using the color material, since the pigment and the dye remove a radical produced therein.

Accordingly, an effort to develop a composition including a quantum dot instead of a dye or a pigment which is capable of remarkably improving reliability such as chemical resistance, heat resistance, and the like is being continuously made by using a different material instead of the existing color material such as a dye, a pigment, or the like.

In addition, new various methods have been used that are capable of replacing an existing pigment dispersion method such as, for example, an inkjet printing method. The inkjet printing method is a method of forming a light-blocking layer such as a black matrix and the like on a glass substrate and injecting ink into the pixel space. The inkjet printing method does not require a separate process such as coating, an exposure, a development, and the like during the manufacture of a color filter and thus may reduce an amount of material required or used in these processes.

When an inkjet ink in the inkjet printing method is used to manufacture a color filter, at least two kinds of pigments are generally mixed to secure desired or required color characteristics. For example, a diketopyrrolopyrrole-based red pigment, for example, C.I. Pigment Red 254 in a red filter is adopted as a main pigment. In addition, an anthraquinone-based red pigment, for example, C.I. Pigment Red 177 or an isoindolinone-based yellow pigment, for example, C.I. Pigment Yellow 139 is generally added as an auxiliary pigment. However, other yellow and orange pigments, for example, C.I. Pigment Yellow 138, C.I Pigment Yellow 150, C.I. Pigment Orange 38, and the like may be added if necessary or desired. These pigments have excellent color characteristics, light resistance, and heat resistance and have been used as a material for a color filter, but as a LCD color filter has recently been more widely used, a higher property level has been being increasingly desired or required. Accordingly, research on atomization and fine dispersion of the pigments to improve color characteristics such as brightness and color purity during the transmission is being made, but there is a limit in realizing the color characteristics of a color filter by actually combining these pigments.

SUMMARY

An embodiment provides a composition including a quantum dot, which maintains a high photo-conversion rate even after it goes through a color filter manufacturing process and is suitable or appropriate for a lithography method and a thermally-curing inkjet printing method.

Another embodiment provides a method of manufacturing a surface-modified quantum dot dispersible in a suitable solvent for a display process such as a color filter and the like.

Another embodiment provides a color filter manufactured by using the composition including a quantum dot.

A composition according to an embodiment is a photosensitive composition that includes (A) a binder resin; (B) a photopolymerizable monomer; (C) a photopolymerization initiator; (D) a quantum dot surface-modified with a first compound having a thiol group at one terminal end or at the middle of a main chain and having an alkoxy group, a cycloalkyl group, a carboxyl group, or a hydroxy group at the other terminal end or a second compound having each thiol group at one terminal end and at the middle of the main chain and having an alkoxy group, a cycloalkyl group, a carboxyl group, or a hydroxy group at the other terminal end; and (E) a solvent.

The alkoxy group may be a C1 to C10 alkoxy group and the cycloalkyl group may be a C3 to C10 cycloalkyl group.

The first compound and the second compound may each independently include an ester group.

A first compound may be represented by Chemical Formula 1 and a second compound may be represented by Chemical Formula 2.

Chemical Formula 1

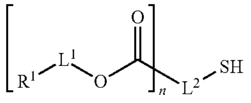

Chemical Formula 2

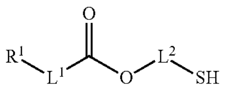

In Chemical Formula 1 and Chemical Formula 2, $R^1$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C6 to C20 aryl group, or a substituted or unsubstituted lactone ring, $R^1$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C6 to C20 aryl group, or a substituted or unsubstituted lactone ring, $L^1$ and $L^2$ are independently a single bond, a substituted or unsubstituted C1 to C20 alkylene group, a substituted or unsubstituted C1 to C20 oxyalkylene group, or a combination thereof and n is an integer of 1 or 2.

The lactone ring may be a 5-membered ring or a 6-membered ring.

In Chemical Formula 2, $L^2$ may be a C1 to C20 alkylene group substituted with a thiol group.

The substituted or unsubstituted C1 to C20 oxyalkylene group may be a substituted or unsubstituted oxymethylene group, a substituted or unsubstituted oxyethylene group, or a combination thereof.

A first compound may be represented by one of Chemical Formula 1-1 to Chemical Formula 1-7 and a second compound may be represented by Chemical Formula 2-1.

Chemical Formula 1-1

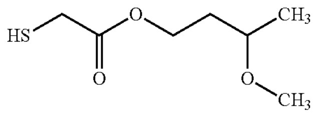

Chemical Formula 1-2

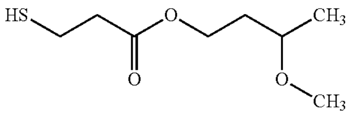

Chemical Formula 1-3

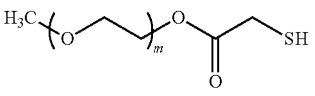

Chemical Formula 1-4

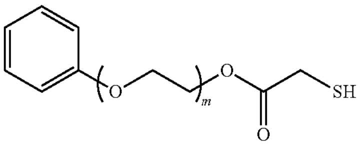

-continued

Chemical Formula 1-5

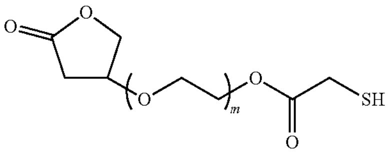

Chemical Formula 1-6

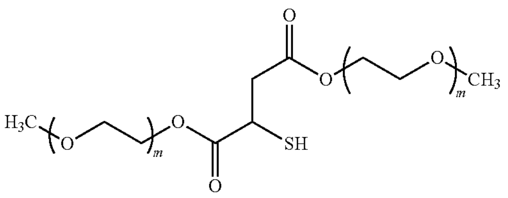

(in Chemical Formula 1-3 to Chemical Formula 1-6, m is an integer of 1 to 5)

Chemical Formula 1-7

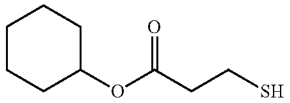

Chemical Formula 2-1

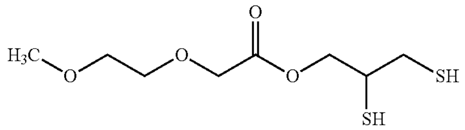

The surface-modified quantum dot may have a core-shell structure, the shell may include Zn, and a thiol group at the terminal end of the compound represented by Chemical Formula 1 or Chemical Formula 2 may be bonded with the Zn of the shell.

The quantum dot may have a maximum fluorescence photoluminescence wavelength in a wavelength range of 500 nm to 680 nm.

The solvent may include propylene glycol monomethylether acetate, dipropylene glycol methylether acetate, ethanol, ethylene glycoldimethylether, ethylene diglycolmethylethylether, diethylene glycoldimethylether, 2-butoxyethanol, N-methylpyrrolidine, N-ethylpyrrolidine, propylene carbonate, γ-butyrolactone, or a combination thereof.

The binder resin may include an acryl-based binder resin, a cardo-based binder resin, or a combination thereof.

The photosensitive composition may further include a (F) diffusion agent.

The diffusion agent may be included in an amount of 0.1 wt % to 20 wt % based on the total amount (total weight) of the photosensitive composition.

The diffusion agent may include barium sulfate, calcium carbonate, titanium dioxide, zirconia, or a combination thereof.

The photosensitive composition may include 1 wt % to 30 wt % of the (A) binder resin; 0.1 wt % to 30 wt % of the (B) photopolymerizable monomer; 0.1 wt % to 10 wt % of the (C) photopolymerization initiator; 1 wt % to 40 wt % of the (D) surface-modified quantum dot; and a balance amount of the (E) solvent based on the total amount (total weight) of the photosensitive composition.

The photosensitive composition may further include malonic acid; 3-amino-1,2-propanediol; a silane-based coupling agent; a leveling agent; a fluorine-based surfactant; a polymerization inhibitor; or a combination thereof.

A composition according to another embodiment as a curable composition includes (A') a resin; (B') a quantum dot surface-modified with the compound represented by Chemical Formula 1 or Chemical Formula 2; and (C') a solvent.

The surface-modified quantum dot is the same as described above.

The (C') solvent may include propylene glycol monomethylether acetate, dipropylene glycol methylether acetate, ethanol, ethylene glycoldimethylether, ethylene diglycolmethylethylether, diethylene glycoldimethylether, dimethyl acetamide, 2-butoxyethanol, N-methylpyrrolidine, N-ethylpyrrolidine, propylene carbonate, γ-butyrolactone, or a combination thereof.

The (A') resin may include a binder resin and a reactive unsaturated compound.

The binder resin may include an acryl-based resin, an epoxy resin, or a combination thereof.

The curable composition may further include a diffusion agent.

The diffusion agent may be included in an amount of 0.1 wt % to 20 wt % based on the total amount (total weight) of the curable composition.

The diffusion agent may include barium sulfate, calcium carbonate, titanium dioxide, zirconia, or a combination thereof.

The curable composition may further include a polymerization initiator.

The polymerization initiator may include a cation initiator.

The curable composition may include, 1 wt % to 40 wt % of the (A') resin; 1 wt % to 40 wt % of the (B') surface-modified quantum dot; and a balance amount of the (C') solvent based on the total amount (total weight) of the curable composition.

The curable composition may further include malonic acid; 3-amino-1,2-propanediol; a silane-based coupling agent; a leveling agent; a fluorine-based surfactant; a polymerization inhibitor; or a combination thereof.

A method of manufacturing the surface-modified quantum dot includes dispersing quantum dots surface-modified with oleic acid in a nonpolar solvent; adding a compound having a thiol group at one terminal end and an alkoxy group, a cycloalkyl group, a carboxyl group, or a hydroxy group at the other terminal end, and a metal salt thereto and stirring the same; and centrifuging the stirred solution to separate a supernatant and lower liquid followed by drying the lower liquid.

The metal salt may be $ZnCl_2$.

The stirring may be performed at a temperature of 60° C. to 70° C.

Another embodiment provides a method of manufacturing a pixel for a color filter, the method including: coating the curable composition on a substrate by an inkjet spraying method to form a pattern; and curing the pattern.

Another embodiment provides a color filter manufactured by using the composition, for example the photosensitive composition or the curable composition.

The color filter manufactured by using the curable composition may include the pixel for the color filter manufactured by the method of manufacturing the pixel.

Other embodiments of the present disclosure are included in the following detailed description.

The surface-modified quantum dot dispersible in a solvent is used in a color filter manufacturing process including an exposure, a development, curing, and the like, and thus, deterioration of absolute quantum efficiency of the quantum dot in the photosensitive composition may be minimized or reduced and a high photo-conversion rate after a lithography process may be maintained.

In addition, a curable composition suitable or appropriate for inkjet printing does not require an additional process such as coating, exposure, development, and the like, and uses the surface-modified quantum dot dispersible in a solvent generally used in the color filter manufacturing process as a colorant, and thus, may minimize or reduce deterioration of absolute quantum efficiency of the quantum dots in the curable composition and maintains a high photo-conversion rate after the thermal curing process.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
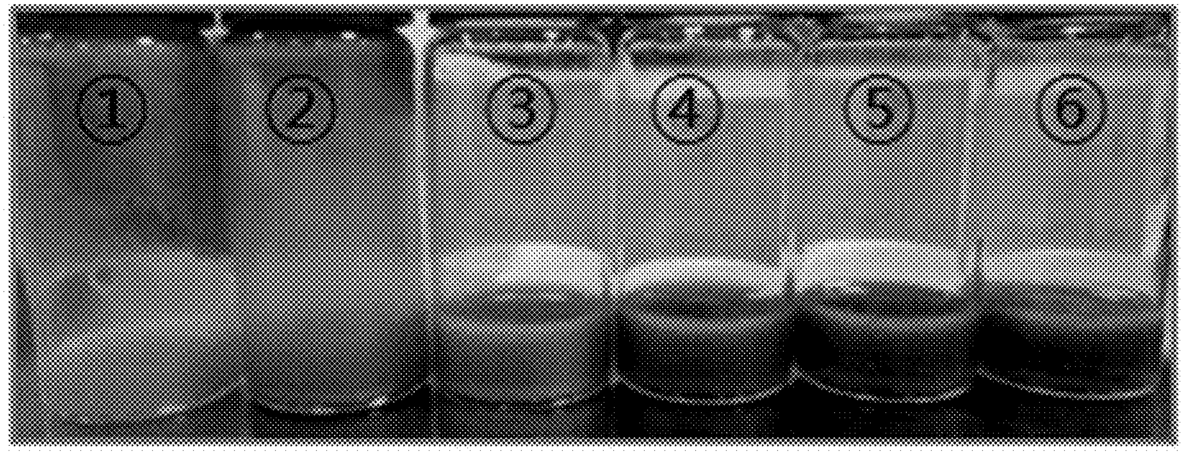
FIG. 1 is an image of a stirred solution after stirring a compound for surface-modifying a quantum dot (a compound having a thiol group at one terminal end and an alkoxy group, a cycloalkyl group, a carboxyl group, or a hydroxy group at the other terminal end) and a metal salt in quantum dots surface-modified with oleic acid and a nonpolar solvent for 12 hours at room temperature (20° C.).

Hereinafter, embodiments of the present disclosure are described in more detail. However, these embodiments are exemplary, the present disclosure is not limited thereto and the scope of the present disclosure is defined by the scope of the appended claims, and equivalents thereof.

As used herein, when a specific definition is not otherwise provided, the term "alkyl group" refers to a C1 to C20 alkyl group, the term "alkenyl group" refers to a C2 to C20 alkenyl group, the term "cycloalkenyl group" refers to a C3 to C20 cycloalkenyl group, the term "heterocycloalkenyl group" refers to a C3 to C20 heterocycloalkenyl group, the term "aryl group" refers to a C6 to C20 aryl group, the term "arylalkyl group" refers to a C6 to C20 arylalkyl group, the term "alkylene group" refers to a C1 to C20 alkylene group, the term "arylene group" refers to a C6 to C20 arylene group, the term "alkylarylene group" refers to a C6 to C20 alkylarylene group, the term "heteroarylene group" refers to a C3 to C20 heteroarylene group, and the term "alkoxylene group" refers to a C1 to C20 alkoxylene group.

As used herein, when a specific definition is not otherwise provided, the term "substituted" refers to replacement of at least one hydrogen by a substituent of a halogen atom (F, Cl, Br, I), a hydroxy group, a C1 to C20 alkoxy group, a nitro group, a cyano group, an amine group, an imino group, an azido group, an amidino group, a hydrazino group, a hydrazono group, a carbonyl group, a carbamyl group, a thiol group, an ester group, an ether group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C20 aryl group, a C3 to C20 cycloalkyl group, a C3 to C20 cycloalkenyl group, a C3 to C20 cycloalkynyl group, a C2 to C20 heterocycloalkyl group, a C2 to C20 heterocycloalkenyl group, a C2 to C20 heterocycloalkynyl group, a C3 to C20 heteroaryl group, or a combination thereof. As used herein, the terms "combination thereof" and "combinations thereof" may refer to a chemical combination (e.g., an alloy or chemical compound), a mixture, or a laminated structure of components.

As used herein, when a specific definition is not otherwise provided, the term "hetero" refers to one substituted with at least one hetero atom of N, O, S and P, in a chemical formula.

As used herein, when a specific definition is not otherwise provided, the term "(meth)acrylate" refers to both "acrylate" and "methacrylate", and the term "(meth)acrylic acid" refers to "acrylic acid" and "methacrylic acid".

As used herein, when a specific definition is not otherwise provided, the term "combination" refers to mixing or copolymerization.

As used herein, unless a specific definition is otherwise provided, a hydrogen atom is bonded at the position when a chemical bond is not drawn where supposed to be given. For example, in the chemical formulae illustrated herein, hydrogen atoms may be omitted from the chemical formulae for clarity.

In the present disclosure, a cardo-based resin refers to a resin including at least one functional group selected from Chemical Formula 100-1 to Chemical Formula 100-11.

As used herein, when a specific definition is not otherwise provided, the symbol "*" indicates a point where the same or different atom or Chemical Formula is linked.

A composition according to an embodiment is a photosensitive composition that includes (A) a binder resin; (B) a photopolymerizable monomer; (C) a photopolymerization initiator; (D) a quantum dot surface-modified with a first compound having a thiol group at one terminal end or at the middle of a main chain and having an alkoxy group, a cycloalkyl group, a carboxyl group, or a hydroxy group at the other terminal end or a second compound having each thiol group at one terminal end and at the middle of the main chain and having an alkoxy group, a cycloalkyl group, a carboxyl group, or a hydroxy group at the other terminal end; and (E) a solvent.

The composition including a quantum dot includes a photopolymerizable monomer, a binder resin, a photopolymerization initiator, a solvent, an additive, and the like. For example, the composition may include any suitable component of a photosensitive composition generally used in the art, but includes a quantum dot (and a diffusion agent) instead of a pigment or a dye, and thus, converts incident blue light after formed into a film. The quantum dot, which plays an important role in the blue photo-conversion, is surrounded with a hydrophobic ligand, and each component of the composition is used to balance for stable dispersion of the quantum dot in the composition to which a hydrophilic solvent other than the ligand is applied. Herein, luminous efficiency of the quantum dot in the composition is determined depending on which composition (or component) is directly combined on the surface of the quantum dot. In addition, since a luminous efficiency loss of the quantum dot in a pattern formation process (a thermal process, an exposure process) is changed depending on the ligand that is directly bonded on (or to) the surface of the quantum dot or a component of the composition, a ligand or a composition capable of stably passivating the surface of the quantum dot is used to realize high photo-conversion efficiency of a composition including a quantum dot.

When the composition including a quantum dot is applied to form a panel, the panel goes through several processes after a photoresist process, sometimes under very severe or harsh conditions. During these processes, a layer formed from the composition including a quantum dot may have damage from oxygen, moisture, heat, and the like, and thus, a photo-conversion function may sharply deteriorate over time. A quantum dot obtained through an initial synthesis has absolute quantum efficiency of greater than or equal to 80% to 90%, and the efficiency decreases through the processes of manufacturing a color filter, and thus, reaches 30% to 40% and then, down to 5% to 20% as the following thermal process is repeated. Accordingly, it is important to maintain high absolute quantum efficiency (PLQY) after all the manufacturing processes in technology of a quantum dot-applied color filter.

A method of increasing photo-conversion efficiency and a photo maintenance rate of the composition including a quantum dot is to add a thiol-based organic material having strong binding affinity with the quantum dot. However, when the thiol-based additive is simply mixed in the composition, this monomolecular additive pursues a kind of equilibrium state of repetitive departures and recombinations from the surface of the quantum dot during formulation of the quantum dot-containing photosensitive resin composition, and this repetitive departure and recombination process decreases quantum efficiency. Subsequently, the departures and recombinations of the thiol-based additive from the surface of the quantum dot is accelerated through a thermal process such as pre-baking and thus promotes the quantum efficiency decrease and resultantly, deteriorates a photo-conversion rate. In addition, the photo-conversion rate may be further deteriorated after the final post-baking, since a physical loss of the ligand from the surface of the quantum dot is increased due to a reaction between thiol and an acrylate-based monomer, as a pattern-forming process proceeds In addition, an attempt to apply a monomer having a set or particular functional group or a binder resin to the composition including a quantum dot has been made to increase a photo-conversion rate and a photo maintenance rate. However, the monomer or the binder resin in a monomolecular state is mostly added to the composition but does not fundamentally block departure of a ligand from the surface of a quantum dot. In order to solve this problem, an attempt to apply an oligomer or a polymer having a multifunctional thiol functional group to firmly passivate the surface of a quantum dot has been made but still did not suitably or satisfactorily suppress (or reduce) the deterioration of a photo-conversion rate.

Meanwhile, the photosensitive composition according to an embodiment may minimize or reduce deterioration of a photo-conversion rate by using a quantum dot surface-modified with a first compound having a thiol group at one terminal end or at the middle of a main chain and having an alkoxy group, a cycloalkyl group, a carboxyl group, or a hydroxy group at the other terminal end or a second compound having each thiol group at one terminal end and at the middle of the main chain and having an alkoxy group, a cycloalkyl group, a carboxyl group, or a hydroxy group at the other terminal end.

Hereinafter, each component is described in more detail.

(D) Surface-Modified Quantum Dot

A quantum dot synthesized according to an existing synthesis method has a ligand system including (or consisting of) a long alkyl chain having hydrophobicity and a head group having hydrophilicity (e.g., carboxylic acid, phosphine, amine, phosphine-oxide, etc.). This ligand stabilizes a dangling bond on the surface of a quantum dot and applies stability to the quantum dot itself and concurrently (e.g., simultaneously), dispersibility of the quantum dot as inorganic particles to a hydrophobic solvent.

However, since the ligand system is not changed as desired according to a quantum dot synthesis condition, the quantum dot is dispersed only in a hydrophobic nonpolar solvent and thus may be limitedly applied to a display process. Currently, a ligand of an InP-based quantum dot mostly includes oleic acid, trioctylamine, trioctylphosphine (-oxide), and the like, and a solvent in which the quantum dot is dispersed includes hexane, cyclohexane, chloroform, toluene, and the like, which are designated as a toxic material due to human toxicity in all the display processes and have unsuitable or inappropriate properties (e.g., a melting point, a boiling point, a vapor pressure, compatibility with other solvents, and the like) apart from the ones used or required during the process.

While the present disclosure is not limited by any particular mechanism or theory, it has been found that hydrophobic and hydrophilic cyclohexyl acetate (CHA) as a solvent in which a quantum dot (oleic acid is a ligand of the quantum dot) is dispersed by using commercially available oleic acid in order to solve this problem, but CHA has a unique smell, which causes hardship to workers during the process, and in addition, when the quantum dot is dispersed in CHA and then, stored for a long time, both dispersibility and storage stability are all deteriorated, and thus photo-conversion efficiency is deteriorated. Accordingly, technology of well dispersing a quantum dot and maintaining excellent dispersibility and photo-conversion efficiency for a long time is desired or required, and accordingly, technology of modifying the surface of the quantum dot with a compound having a thiol group at one terminal end or at the middle of a main chain and having an alkoxy group, a cycloalkyl group, a carboxyl group, or a hydroxy group at the other terminal end or a compound having each thiol group at one terminal end and at the middle of the main chain and having an alkoxy group, a cycloalkyl group, a carboxyl group, or a hydroxy group at the other terminal end is developed.

Dispersibility of the quantum dot in a suitable solvent for a display process (e.g., a hydrophobic polar solvent) is improved or optimized by using a thiol group having affinity for the surface of the quantum dot to substitute (ligand-exchange) oleic acid on the surface of the quantum dot and in addition, including an alkoxy group, a cycloalkyl group, a carboxyl group, or a hydroxy group at the terminal end of the thiol group-containing compound. In addition, the compound modifying the surface of the quantum dot has only one thiol group at the terminal end or at the middle of a main chain (monodendrite) may further improve dispersibility about an organic solvent compared with a compound having at least two thiol groups (polydendrite).

The compound modifying the surface of the quantum dot has a thiol group at one terminal end or at the middle of a main chain and an alkoxy group, a cycloalkyl group, a carboxyl group, or a hydroxy group at the other terminal end, wherein the alkoxy group may be a C1 to C10 alkoxy group and the cycloalkyl group may be a C3 to C10 cycloalkyl group.

For example, a first compound modifying the surface of the quantum dot may be represented by one of Chemical Formula 1-1 to Chemical Formula 1-8 and a second compound modifying the surface of the quantum dot may be represented by Chemical Formula 2-1.

Chemical Formula 1

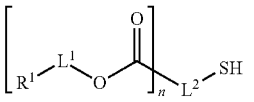

Chemical Formula 2

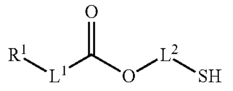

$R^1$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C6 to C20 aryl group, or a substituted or unsubstituted lactone ring, $L^1$ and $L^2$ are independently a single bond, a substituted or unsubstituted C1 to C20 alkylene group, a substituted or unsubstituted C1 to C20 oxyalkylene group, or a combination thereof, and n is an integer of 1 or 2.

The lactone ring may be a 5-membered ring or a 6-membered ring.

In Chemical Formula 2, $L^2$ may be a C1 to C20 alkylene group substituted with a thiol group.

The substituted or unsubstituted C1 to C20 oxyalkylene group may be a substituted or unsubstituted oxymethylene group, a substituted or unsubstituted oxyethylene group, or a combination thereof.

Chemical Formula 1-1

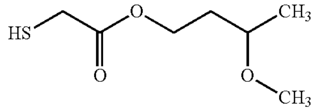

Chemical Formula 1-2

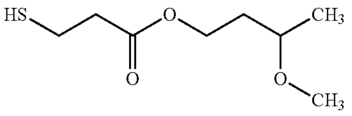

Chemical Formula 1-3

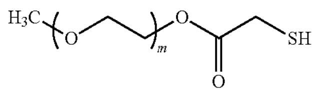

Chemical Formula 1-4

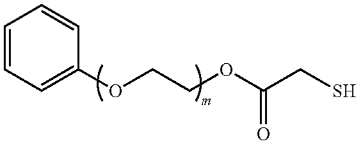

Chemical Formula 1-5

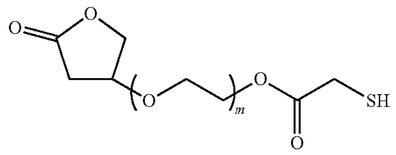

-continued

Chemical Formula 1-6

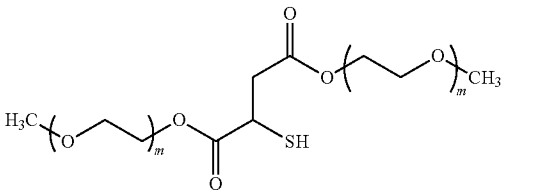

(in Chemical Formula 1-3 to Chemical Formula 1-6, m is an integer of 1 to 5.)

Chemical Formula 1-7

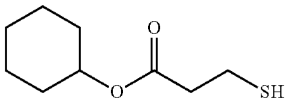

Chemical Formula 1-8

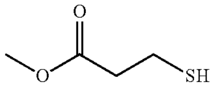

Chemical Formula 2-1

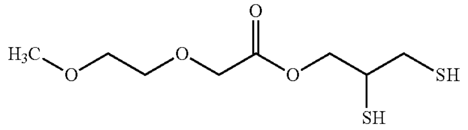

For example, a curable composition according to an embodiment may use compounds represented by Chemical Formula A-1 to Chemical Formula A-11 in addition to the compounds represented by Chemical Formula 1 and Chemical Formula 2 as a surface-modifying compound.

Chemical Formula A-1

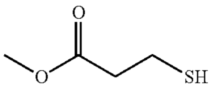

Chemical Formula A-2

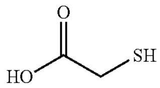

Chemical Formula A-3

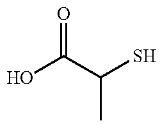

Chemical Formula A-4

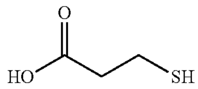

Chemical Formula A-5

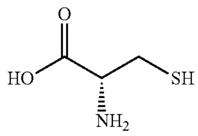

-continued

Chemical Formula A-6

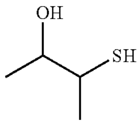

Chemical Formula A-7

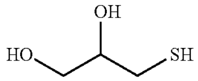

Chemical Formula A-8

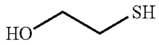

Chemical Formula A-9

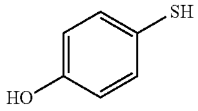

Chemical Formula A-10

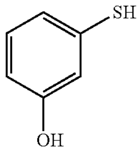

Chemical Formula A-11

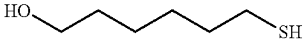

The surface-modified quantum dot may have a core-shell structure wherein the shell includes Zn, and the thiol group at the terminal end of the compound represented by Chemical Formula 1 or Chemical Formula 2 may be bonded with the Zn of the shell.

For example, the quantum dot may absorb light in a wavelength region of 360 nm to 780 nm, for example 400 nm to 780 nm and emit fluorescence in a wavelength region of 500 nm to 700 nm, for example, 500 nm to 580 nm, or 600 nm to 680 nm. In some embodiments, the quantum dot may have a maximum fluorescence wavelength (fluorescence $\lambda_{em}$) in a wavelength range of 500 nm to 680 nm.

The quantum dot may independently have a full width at half maximum (FWHM) in a range of 20 nm to 100 nm, for example, 20 nm to 50 nm. When the quantum dot has a full width at half maximum (FWHM) within the ranges, the quantum dot has high color purity, and thus, an effect of increasing color reproducibility when used as a color material in a color filter.

The quantum dot may independently be an organic material, an inorganic material, or a hybrid (mixture) of the organic material and the inorganic material.

The quantum dot may independently include a core and a shell surrounding the core, and herein, the core and the shell may have a structure such as a core independently including Group II-IV, Group III-V, and the like, a core/a shell, a core/a first shell/a second shell, an alloy, an alloy/a shell, and the like but are not limited thereto.

For example, the core may include at least one material selected from CdS, CdSe, CdTe, ZnS, ZnSe, ZnTe, HgS, HgSe, HgTe, GaN, GaP, GaAs, InP, InAs, and an alloy thereof but is not necessarily limited thereto. The shell surrounding the core may include at least one material selected from CdSe, ZnSe, ZnS, ZnTe, CdTe, PbS, TiO, SrSe, HgSe, and an alloy thereof but is not necessarily limited thereto.

In an embodiment, since an interest in protecting the environment has been recently much increased around the world, and regulations of toxic materials also have been increased and/or fortified, a non-cadmium-based light emitting material (InP/ZnS, InP/ZeSe/ZnS, etc.) having little low quantum efficiency (quantum yield) but being environmentally-friendly instead of a light emitting material having a cadmium-based core is used, but not necessarily limited thereto.

The quantum dot having a core/shell structure may have an entire size (e.g., may have a total average particle diameter) including the shell (an average particle diameter) of 1 nm to 15 nm, for example, 5 nm to 15 nm.

For example, the quantum dot may independently include a red quantum dot, a green quantum dot, or a combination thereof. The red quantum dot may independently have an average particle diameter of 10 nm to 15 nm. The green quantum dot may independently have an average particle diameter of 5 nm to 8 nm.

On the other hand, for dispersion stability of the quantum dot, a photosensitive resin composition according to an embodiment may further include a dispersing agent. The dispersing agent helps uniform (e.g., substantially uniform) dispersibility of a photo-conversion material such as a quantum dot in the photosensitive resin composition and may include a non-ionic, anionic, or cationic dispersing agent. For example, the dispersing agent may be polyalkylene glycol or esters thereof, a polyoxy alkylene, a polyhydric alcohol ester alkylene oxide addition product, an alcohol alkylene oxide addition product, a sulfonate ester, a sulfonate salt, a carboxylate ester, a carboxylate salt, an alkyl amide alkylene oxide addition product, an alkyl amine and the like, and they may be used alone or in a mixture of two or more. The dispersing agent may be used in an amount of 0.1 wt % to 100 wt %, for example 10 wt % to 20 wt % relative to a solid content of the photo-conversion material such as a quantum dot.

The surface-modified quantum dot may be included in an amount of 1 wt % to 40 wt %, for example 3 wt % to 30 wt % based on the total amount (total weight) of the photosensitive composition. When the surface-modified quantum dot is included within the foregoing ranges, a photo-conversion rate is improved and excellent processability may be provided by not decreasing pattern characteristics and development characteristics.

(A) Binder Resin

The binder resin may include an acryl-based binder resin, a cardo-based binder resin, or a combination thereof.

The acryl-based binder resin is a copolymer of a first ethylenic unsaturated monomer and a second ethylenic unsaturated monomer that is copolymerizable therewith, and may be a resin including at least one acryl-based repeating unit.

The first ethylenic unsaturated monomer is an ethylenic unsaturated monomer including at least one carboxyl group and examples of the monomer include acrylic acid, methacrylic acid, maleic acid, itaconic acid, fumaric acid, or a combination thereof.

The first ethylenic unsaturated monomer may be included in an amount of 5 wt % to 50 wt %, for example, 10 wt % to 40 wt % based on the total amount (total weight) of the acryl-based binder resin.

The second ethylenic unsaturated monomer may be an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth)acrylonitrile and the like; an unsaturated amide compound such as (meth)acrylamide, and the like; and the like, and may be used alone or as a mixture of two or more.

Examples of the acryl-based binder resin may be a polybenzylmethacrylate, (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth) acrylic acid/benzylmethacrylate/styrene/2-hydroxyethylmethacrylate copolymer, and the like, but are not limited thereto, and may be used alone or as a mixture of two or more.

A weight average molecular weight of the acryl-based binder resin may be 5,000 g/mol to 15,000 g/mol. When the acryl-based binder resin has a weight average molecular weight within the foregoing range, close-contacting properties to a substrate, physical and chemical properties are improved, and a viscosity is suitable or appropriate.

An acid value of the acryl-based binder resin may be 80 mg KOH/g to 130 mg KOH/g. When the acryl-based binder resin has an acid value within the foregoing range, excellent resolution of a pixel may be obtained.

The cardo-based binder resin may include a repeating unit represented by Chemical Formula 100.

Chemical Formula 100

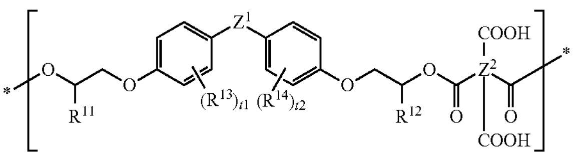

In Chemical Formula 100, $R^{11}$ and $R^{12}$ are independently a hydrogen atom or a substituted or unsubstituted (meth)acryloyloxy alkyl group, $R^{13}$ and $R^{14}$ are independently a hydrogen atom, a halogen atom, or a substituted or unsubstituted C1 to C20 alkyl group, $Z^1$ is a single bond, O, CO, $SO_2$, $CR^{17}R^{18}$, $SiR^{19}R^{20}$ (wherein, $R^{17}$ to $R^{20}$ are independently a hydrogen atom or a substituted or unsubstituted C1 to C20 alkyl group), or one of linking groups represented by Chemical Formula 100-1 to Chemical Formula 100-11, Chemical Formula 100-1

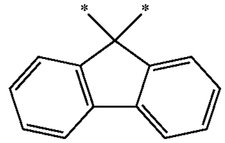

Chemical Formula 100-2

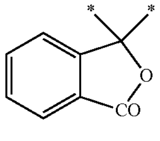

-continued

Chemical Formula 100-3

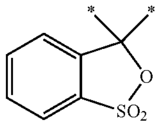

Chemical Formula 100-4

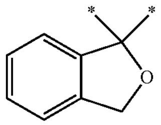

Chemical Formula 100-5

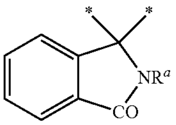

(in Chemical Formula 100-5, $R^a$ is a hydrogen atom, an ethyl group, $C_2H_4Cl$, $C_2H_4OH$, $CH_2CH{=}CH_2$, or a phenyl group.)

Chemical Formula 100-6

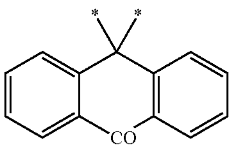

Chemical Formula 100-7

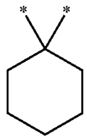

Chemical Formula 100-8

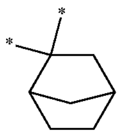

Chemical Formula 100-9

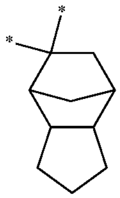

Chemical Formula 100-10

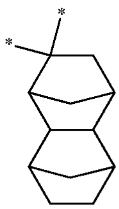

Chemical Formula 100-11

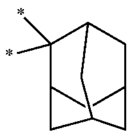

$Z^2$ is an acid anhydride residual group, and t1 and t2 are independently an integer in a range of 0 to 4.

A weight average molecular weight of the cardo-based binder resin may be 500 g/mol to 50,000 g/mol, for example 1,000 g/mol to 30,000 g/mol. When the weight average molecular weight of the cardo-based binder resin is within the foregoing ranges, a suitable or satisfactory pattern may be formed without a residue during a manufacture of a photosensitive organic film and without losing a film thickness during development.

The cardo-based binder resin may include a functional group represented by Chemical Formula 101 at at least one terminal end of both terminal ends.

Chemical Formula 101

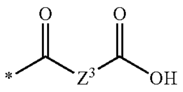

In Chemical Formula 101, $Z^3$ is represented by Chemical Formula 101-1 to Chemical Formula 101-7.

Chemical Formula 101-1

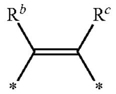

(in Chemical Formula 101-1, $R^b$ and $R^c$ are independently a hydrogen atom, a substituted or unsubstituted C1 to C20 alkyl group, an ester group, or an ether group.)

Chemical Formula 101-2

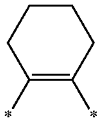

Chemical Formula 101-3

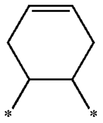

Chemical Formula 101-4

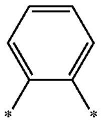

Chemical Formula 101-5

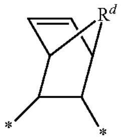

(in Chemical Formula 101-5, $R^d$ is O, S, NH, a substituted or unsubstituted C1 to C20 alkylene group, C1 to C20 alkylamine group, or C2 to C20 alkenylamine group.)

Chemical Formula 101-6

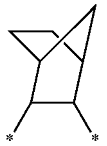

Chemical Formula 101-7

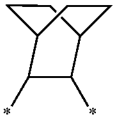

The cardo-based binder resin may be, for example prepared by mixing at least two of a fluorene-containing compound such as 9,9-bis (4-oxiranylmethoxyphenyl)fluorene; an anhydride compound such as benzenetetracarboxylic acid dianhydride, naphthalenetetracarboxylic acid dianhydride, biphenyltetracarboxylic acid dianhydride, benzophenonetetracarboxylic acid dianhydride, pyromellitic dianhydride, cyclobutanetetracarboxylic acid dianhydride, perylenetetracarboxylic acid dianhydride, tetrahydrofurantetracarboxylic acid dianhydride, and tetrahydrophthalic anhydride; a glycol compound such as ethylene glycol, propylene glycol, and polyethylene glycol; an alcohol compound such as methanol, ethanol, propanol, n-butanol, cyclohexanol, and benzylalcohol; a solvent-based compound such as propylene glycol methylethylacetate, and N-methylpyrrolidone; a phosphorus compound such as triphenylphosphine; and and an amine or ammonium salt compound such as tetramethylammonium chloride, tetraethylammonium bromide, benzyldiethylamine, triethylamine, tributylamine, benzyltriethylammonium chloride.

When the binder resin is a cardo-based binder resin, the photosensitive composition including the same has excellent developability and sensitivity during photo-curing, and thus, has fine pattern-forming capability.

The binder resin may include a thiol group.

The binder resin may be included in an amount of 1 wt % to 30 wt %, for example 3 wt % to 20 wt % based on the total amount (total weight) of the photosensitive composition. When the binder resin is included within the foregoing ranges, excellent sensitivity, developability, resolution, and pattern linearity may be obtained.

(B) Photopolymerizable Monomer

The photopolymerizable monomer may be mono-functional or multi-functional ester of (meth)acrylic acid including at least one ethylenic unsaturated double bond.

The photopolymerizable monomer has the ethylenic unsaturated double bond, and thus, may cause suitable or sufficient polymerization during exposure in a pattern-forming process and form a pattern having excellent heat resistance, light resistance, and chemical resistance.

Examples of the photopolymerizable monomer may be ethylene glycol di(meth)acrylate, diethylene glycol di(meth) acrylate, triethylene glycol di(meth)acrylate, propylene glycol di(meth)acrylate, neopentyl glycol di(meth)acrylate, 1,4-butanediol di(meth)acrylate, 1,6-hexanediol di(meth) acrylate, bisphenol A di(meth)acrylate, pentaerythritol di(meth)acrylate, pentaerythritol tri(meth)acrylate, pentaerythritol tetra(meth)acrylate, pentaerythritol hexa(meth) acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, ethylene glycol monomethylether (meth) acrylate, trimethylol propane tri(meth)acrylate, tris(meth) acryloyloxyethyl phosphate, novolac epoxy (meth)acrylate, and the like.

Commercially available examples of the photopolymerizable monomer are as follows. Examples of the mono-functional ester of (meth)acrylic acid may include Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), and the like. Examples of a difunctional ester of (meth)acrylic acid may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional ester of (meth)acrylic acid may include Aronix M-309®, M-400®, M-405®, M-450®, M-7100®, M-8030®, M-8060® (Toagosei Chemistry Industry Co., Ltd.), KAYARAD TMPTA®, DPCA-20®, DPCA-30®, DPCA-60®, DPCA-120® (Nippon Kayaku Co., Ltd.), V-295®, V-300®, V-360®, V-GPT®, V-3PA®, V-400® (Osaka Yuki Kayaku Kogyo Co. Ltd.), and the like. These may be used alone or as a mixture of two or more.

The photopolymerizable monomer may be treated with acid anhydride to improve developability.

The photopolymerizable monomer may be included in an amount of 0.1 wt % to 30 wt %, for example 1 wt % to 20 wt % based on the total amount (total weight) of the photosensitive composition. When the photopolymerizable monomer is included within the foregoing ranges, the photopolymerizable monomer is suitably or sufficiently cured during exposure in a pattern-forming process and thus reliability is improved and heat resistance, light resistance, chemical resistance, resolution and a close contacting property of a pattern may be improved.

(C) Photopolymerization Initiator

The photopolymerization initiator may be a generally-used initiator for a photosensitive composition, for example an acetophenone-based compound, a benzophenone-based compound, a thioxanthone-based compound, a benzoin-based compound, a triazine-based compound, an oxime-based compound, and the like.

Examples of the acetophenone-based compound may be 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may be benzophenone, benzoyl benzoate, benzoyl methyl benzoate, 4-phenyl benzophenone, hydroxybenzophenone, acrylated benzophenone, 4,4'-bis(dimethyl amino)benzophenone, 4,4'-bis(diethylamino)benzophenone, 4,4'-dimethylamino-benzophenone, 4,4'-dichlorobenzophenone, 3,3'-dimethyl-2-methoxybenzophenone, and the like.

Examples of the thioxanthone-based compound may be thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may be benzoin, benzoin methyl ether, benzoin ethyl ether, benzoin isopropyl ether, benzoin isobutyl ether, benzyldimethylketal, and the like.

Examples of the triazine-based compound may be 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl-4,6-bis(trichloro methyl)-s-triazine, bis(trichloromethyl)-6-styryl-s-triazine, 2-(naphtho1-yl)-4,6-bis(trichloromethyl)-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may be O-acyloxime-based compound, 2-(O-benzoyloxime)-1-[4-(phenylthio)phenyl]-1,2-octandione, 1-(0-acetyloxime)-1-[9-ethyl-6-(2-methylbenzoyl)-9H-carbazol-3-yl]ethanone, O-ethoxycarbonyl-α-oxyamino-1-phenylpropan-1-one, and the like. Examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione-2-oxime-O-benzoate, 1-(4-phenylsulfanyl phenyl)-octane-1,2-dione-2-oxime-O-benzoate, 1-(4-phenylsulfanyl phenyl)-octan-1-oneoxime-O-acetate, 1-(4-phenylsulfanyl phenyl)-butan-1-oneoxime-O-acetate, and the like.

The photopolymerization initiator may further include a carbazole-based compound, a diketone-based compound, a sulfonium borate-based compound, a diazo-based compound, an imidazole-based compound, a biimidazole-based compound, a fluorene-based compound, and the like in addition to the foregoing compounds.

The photopolymerization initiator may be used with a photosensitizer capable of causing a chemical reaction by absorbing light and becoming excited and then, transferring its energy.

Examples of the photosensitizer may be tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of 0.1 wt % to 10 wt %, for example 0.1 wt % to 5 wt % based on the total amount (total weight) of photosensitive composition. When the photopolymerization initiator is included within the foregoing ranges, a balance between sensitivity and developability during exposure is improved and a pattern having improved resolution without a residual film may be obtained.

(E) Solvent

When a photosensitive resin composition includes a photo-conversion material such as a quantum dot and the like instead of a pigment or a dye as a color material, a solvent generally used for the photosensitive resin composition, for example, a polar solvent such as propylene glycol monomethylether acetate, ethanol, ethylene diglycolmethylethylether, and the like is difficult to use. However, as described above, since a quantum dot is surface-treated by the compound having one thiol group at a terminal end and/or at the middle of the main chain and an alkoxy group, a cycloalkyl group, a carboxyl group, or a hydroxy group at the terminal end according to an embodiment, the quantum dot may be used in the polar solvent, and furthermore, the deterioration problem of a photo-conversion rate of the quantum dot may be solved or reduced.

For example, the photosensitive composition according to an embodiment may include, as a solvent alcohols such as methanol, ethanol, and the like; glycol ethers such as ethylene glycol methylether, ethylene glycol ethylether, propylene glycol methylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactate esters such as methyl lactate, ethyl lactate, and the like; hydroxy acetic acid alkyl esters such as methyl hydroxyacetate, ethyl hydroxyacetate, butyl hydroxyacetate, and the like; acetic acid alkoxyalkyl esters such as methoxymethyl acetate, methoxyethyl acetate, methoxybutyl acetate, ethoxymethyl acetate, ethoxyethyl acetate, and the like; 3-hydroxypropionic acid alkyl esters such as methyl 3-hydroxypropionate, ethyl 3-hydroxypropionate, and the like; 3-alkoxypropionic acid alkyl esters such as methyl 3-methoxypropionate, ethyl 3-methoxypropionate, ethyl 3-ethoxypropionate, methyl 3-ethoxypropionate, and the like; 2-hydroxypropionic acid alkyl ester such as methyl 2-hydroxypropionate, ethyl 2-hydroxypropionate, propyl 2-hydroxypropionate, and the like; 2-alkoxypropionic acid alkyl esters such as methyl 2-methoxypropionate, ethyl 2-methoxypropionate, ethyl 2-ethoxypropionate, methyl 2-ethoxypropionate, and the like; 2-hydroxy-2-methylpropionic acid alkyl esters such as methyl 2-hydroxy-2-methylpropionate, ethyl 2-hydroxy-2-methylpropionate, and the like; 2-alkoxy-2-methylpropionic acid alkyl esters such as methyl 2-methoxy-2-methylpropionate, ethyl 2-ethoxy-2-methylpropionate, and the like; esters such as 2-hydroxyethyl propionate, 2-hydroxy-2-methylethyl propionate, hydroxyethyl acetate, methyl 2-hydroxy-3-methylbutanoate, and the like; or ketonate esters such as ethyl pyruvate, and the like, and in addition, may be N-methylformamide, N,N-dimethyl formamide, N-methylformanilide, N-methylacetamide, N,N-dimethyl acetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like, but is not limited thereto.

For example, the solvent may be desirably glycol ethers such as ethylene glycol monoethylether, ethylene diglycolmethylethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like; alcohols such as ethanol, and the like, or a combination thereof.

For example, the solvent may include propylene glycol monomethylether acetate, dipropylene glycol methylether acetate, ethanol, ethylene glycoldimethylether, ethylene diglycolmethylethylether, diethylene glycoldimethylether, 2-butoxyethanol, N-methylpyrrolidine, N-ethylpyrrolidine, propylene carbonate, γ-butyrolactone, or a combination thereof.

The solvent may be included in a balance amount, for example 20 wt % to 80 wt %, for example 35 wt % to 80 wt % based on the total amount (total weight) of the photosensitive composition. When the solvent is within the foregoing ranges, the photosensitive composition has suitable or appropriate viscosity and thus may have excellent coating property when coated in a large area through spin-coating and slit-coating.

(F) Diffusion Agent (or Diffusion Agent Dispersion)

The photosensitive composition according to an embodiment may further include a diffusion agent.

For example, the diffusion agent may include barium sulfate ($BaSO_4$), calcium carbonate ($CaCO_3$), titanium dioxide ($TiO_2$), zirconia ($ZrO_2$), or a combination thereof.

The diffusion agent reflects light not absorbed in the above photo-conversion material, so that the reflected light may be adsorbed again in the photo-conversion material. In other words, the diffusion agent increases a dose of the light absorbed in the photo-conversion material and thus photo-conversion efficiency of the photosensitive resin composition.

The diffusion agent may have an average particle diameter (e.g., $D_{50}$) of 150 nm to 250 nm, for example, 180 nm to 230 nm. When the diffusion agent has an average particle diameter within the foregoing ranges, much more excellent light scattering effects may be obtained, and photo-conversion efficiency may be increased.

The diffusion agent may be included in an amount of 0.1 wt % to 20 wt %, for example 1 wt % to 15 wt % based on a total solid amount of the photosensitive resin composition. When the diffusion agent is included in an amount of less than 0.1 wt % based on a total weight of the photosensitive composition, improvement of photo-conversion efficiency may be difficult to obtain, while when the scatterer is included in an amount of greater than 20 wt %, pattern characteristics may be deteriorated.

(G) Other Additives

The photosensitive resin composition according to an embodiment may further include a polymerization inhibitor including a hydroquinone-based compound, a catechol-based compound, or a combination thereof. The photosensitive resin composition according to an embodiment may inhibit or reduce cross-linking at room temperature during exposure after coating the photosensitive composition by further including the hydroquinone-based compound, the catechol-based compound, or the combination thereof.

For example, the hydroquinone-based compound, the catechol-based compound, or the combination thereof may be hydroquinone, methyl hydroquinone, methoxyhydroquinone, t-butyl hydroquinone, 2,5-di-t-butyl hydroquinone, 2,5-bis(1,1-dimethylbutyl) hydroquinone, 2,5-bis (1,1,3,3-tetramethylbutyl) hydroquinone, catechol, t-butyl catechol, 4-methoxyphenol, pyrogallol, 2,6-di-t-butyl-4-methylphenol, 2-naphthol, tris(N-hydroxy-N-nitrosophenylaminato-O, O')aluminum, or a combination thereof, but are not limited thereto.

The hydroquinone-based compound, catechol-based compound or combination thereof may be used in a form of dispersion, and the polymerization inhibitor in a form of the dispersion may be included in an amount of 0.001 wt % to 1 wt %, for example 0.01 wt % to 0.1 wt % based on the total amount (total weight) of the photosensitive composition. When the polymerization inhibitor is included within the foregoing ranges, passage of time at room temperature may be solved or reduced and concurrently (e.g., simultaneously), sensitivity deterioration and surface delamination phenomenon may be inhibited or reduced.

In addition, the photosensitive resin composition according to an embodiment may further include malonic acid; 3-amino-1,2-propanediol; a silane-based coupling agent; a leveling agent; a fluorine-based surfactant; or a combination thereof in order to improve heat resistance and reliability.

For example, the photosensitive composition may further include a silane-based coupling agent having a reactive substituent such as a vinyl group, a carboxyl group, a methacryloxy group, an isocyanate group, an epoxy group and the like in order to improve close contacting properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like, and these may be used alone or in a mixture of two or more.

The silane-based coupling agent may be used in an amount of 0.01 parts by weight to 10 parts by weight based on 100 parts by weight of the photosensitive composition. When the silane-based coupling agent is included within the foregoing ranges, close contacting properties, storage capability, and the like are improved.

The photosensitive composition may further include a surfactant, for example a fluorine-based surfactant as needed or desired in order to improve coating properties and inhibit or reduce generation of spots (e.g., improve leveling performance).

The fluorine-based surfactant may have a low weight average molecular weight of 4,000 g/mol to 10,000 g/mol, and, for example, 6,000 g/mol to 10,000 g/mol. In addition, the fluorine-based surfactant may have a surface tension of 18 mN/m to 23 mN/m (measured in a 0.1% polyethylene glycol monomethylether acetate (PGMEA) solution). When the fluorine-based surfactant has a weight average molecular weight and a surface tension within the foregoing ranges, leveling performance may be further improved, and excellent characteristics may be provided when slit coating as high speed coating is applied since film defects may be less generated by preventing (or reducing) a spot generation during the high speed coating and suppressing (or reducing) the generation of vapor generation.

Examples of the fluorine-based surfactant may be, BM-1000®, and BM-1100® (BM Chemie Inc.); MEGAFACE F 142D®, F 172®, F 173®, and F 183® Dainippon Ink Kagaku Kogyo Co., Ltd.); FULORAD FC-135®, FULORAD FC-170C®, FULORAD FC-430®, and FULORAD FC-431® (Sumitomo 3M Co., Ltd.); SURFLON S-112®, SURFLON S-113®, SURFLON S-131®, SURFLON S-141®, and SURFLON S-145® (ASAHI Glass Co., Ltd.); and SH-28PA®, SH-190®, SH-193®, SZ-6032®, and SF-8428®, and the like (Toray Silicone Co., Ltd.); F-482, F-484, F-478, F-554 and the like of DIC Co., Ltd.

The surfactant may further include a silicone-based surfactant in addition to the fluorine-based surfactant. Examples of the silicone-based surfactant may be TSF400, TSF401, TSF410, TSF4440, and the like of Toshiba silicone Co., Ltd., but is not limited thereto.

The surfactant may be included in an amount of 0.01 parts by weight to 5 parts by weight, for example 0.1 parts by weight to 2 parts by weight based on 100 parts by weight of the photosensitive composition. When the surfactant is included within the foregoing ranges, foreign materials are less produced after the development.

In addition, the photosensitive composition according to an embodiment may further include other additives such as an antioxidant, a stabilizer, and the like in a set or predetermined amount, unless the resultant properties are deteriorated.

Another embodiment provides a curable composition including (A') a resin; (B') a quantum dot surface-modified with the compound represented by Chemical Formula 1 or Chemical Formula 2; and (C') a solvent.

Since the curable composition according to another embodiment does not require an additional process such as an exposure, a development, curing, or the like, the quantum efficiency deterioration of the quantum dot in the curable composition may be minimized or reduced, and furthermore, deterioration of a photo-conversion rate may be minimized or reduced by surface-modifying the quantum dot with the compound represented by Chemical Formula 1 or 2. For example, a different curable composition according to another embodiment is very suitable or appropriate for an inkjet process, and thus, does not have (or substantially does not have) a problem according to an existing lithography problem, for example, a problem of rarely forming a fine pattern due to lack of light source energy.

Hereinafter, each component is described in more detail.

(A') Resin

The (A') resin may include a binder resin and a reactive unsaturated compound.

The binder resin may include an acryl-based resin, an epoxy resin, or a combination thereof.

The acryl-based resin is a copolymer of a first ethylenic unsaturated monomer and a second ethylenic unsaturated monomer that is copolymerizable therewith, and may be a resin including at least one acryl-based repeating unit.

The first ethylenic unsaturated monomer is an ethylenic unsaturated monomer including at least one carboxyl group and examples of the monomer include acrylic acid, methacrylic acid, maleic acid, itaconic acid, fumaric acid, or a combination thereof.

The first ethylenic unsaturated monomer may be included in an amount of 5 to 50 wt %, for example, 10 to 40 wt % based on the total amount (total weight) of the acryl-based binder resin.

The second ethylenic unsaturated monomer may be an aromatic vinyl compound such as styrene, α-methylstyrene, vinyl toluene, vinylbenzylmethylether and the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, and the like; an unsaturated amino alkyl carboxylate ester compound such as 2-aminoethyl(meth) acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth) acrylonitrile and the like; an unsaturated amide compound such as (meth)acrylamide, and the like; and the like, and may be used alone or as a mixture of two or more.

Examples of the acryl-based binder resin may be a polybenzylmethacrylate, (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth) acrylic acid/benzylmethacrylate/styrene/2-hydroxyethylmethacrylate copolymer, and the like, but are not limited thereto, and may be used alone or as a mixture of two or more.

A weight average molecular weight of the acryl-based resin may be 5,000 g/mol to 15,000 g/mol. When the acryl-based resin has a weight average molecular weight within the foregoing range, close-contacting properties to a substrate, physical and chemical properties are improved, and a viscosity is suitable or appropriate.

An acid value of the acryl-based resin may be 80 mg KOH/g to 130 mgKOH/g. When the acryl-based resin has an acid value within the foregoing range, excellent resolution of a pixel may be obtained.

The epoxy resin may be a thermally polymerizable monomer or oligomer, and may include a compound having a carbon-carbon unsaturated bond and a carbon-carbon cyclic bond.

For example, the epoxy resin may be at least two kinds of epoxy resins essentially including a compound represented by Chemical Formula 5-1 and a compound represented by Chemical Formula 5-2.

Chemical Formula 5-1

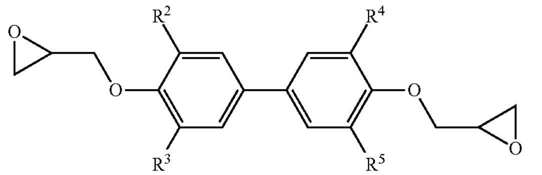

Chemical Formula 5-2

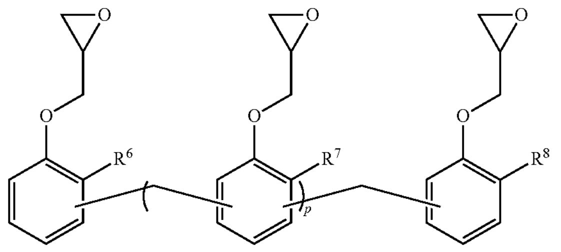

(in Chemical Formula 5-1 and Chemical Formula 5-2, $R^2$ to $R^8$ are independently a hydrogen atom, a halogen atom, or C1 to C5 alkyl group, and p is an integer in a range of 0 to 25.)

The epoxy resin may further include a bisphenol A epoxy resin, a bisphenol F epoxy resin, a phenol novolac epoxy resin, a cyclic aliphatic epoxy resin, and an aliphatic polyglycidyl ether in addition to the compounds of Chemical Formula 5-1 and Chemical Formula 5-2.

As commercially available examples of such compounds, a bisphenyl epoxy resin represented by Chemical Formula 5-1 may be YX4000, YX4000H, YL6121H, YL6640, or YL6677 of Yuka Shell Epoxy Co.; a cresol novolac epoxy resin represented by Chemical Formula 5-2 may be EOCN-102, EOCN-103S, EOCN-104S, EOCN-1020, EOCN-1025, or EOCN-1027 of Nippon Kayaku Co. Ltd. and EPIKOTE 180S75 of Yuka Shell Epoxy Co.; a bisphenol A epoxy resin may be EPIKOTE 1001, 1002, 1003, 1004, 1007, 1009, 1010 and 828 of Yuka Shell Epoxy Co.; a bisphenol F epoxy resin may be EPIKOTE 807 and 834 of Yuka Shell Epoxy Co.; a phenol novolac epoxy resin may be EPIKOTE 152, 154, or 157H65 of Yuka Shell Epoxy Co. and EPPN 201, 202 of Nippon Kayaku Co. Ltd.; a cyclic aliphatic epoxy resin may be CY175, CY177 and CY179 of CIBA-GEIGY A.G Corp., ERL-4234, ERL-4299, ERL-4221 and ERL-4206 of U.C.C., Showdyne 509 of Showa Denko K.K., Araldite CY-182 of CIBA-GEIGY A.G Corp., CY-192 and CY-184, Dainippon Ink & Chemicals Inc. EPICLON 200 and 400, EPIKOTE 871, 872 of Yuka Shell Epoxy Co. and EP1032H60, ED-5661 and ED-5662 of Celanese Coating Corporation; an aliphatic polyglycidylether may be EPIKOTE 190P and 191P of Yuka Shell Epoxy Co., EPOLITE 100MF of Kyoeisha Yushi Kagaku Kogyo Co., Ltd., EPIOL TMP of Nihon Yushi K. K., and the like.

The reactive unsaturated compound may be used with a generally-used monomer or oligomer in an existing thermosetting composition.

The reactive unsaturated compound may be for example one or more selected from ethylene glycoldiacrylate, triethylene glycoldiacrylate, 1,4-butanedioldiacrylate, 1,6-hexanedioldiacrylate, neopentylglycoldiacrylate, pentaerythritoldiacrylate, pentaerythritoltriacrylate, dipentaerythritoldiacrylate, dipentaerythritoltriacrylate, dipentaerythritolpentaacrylate, pentaerythritolhexaacrylate, bisphenol A diacrylate, trimethylolpropanetriacrylate, novolacepoxyacrylate, ethylene glycoldimethacrylate, diethylene glycoldimethacrylate, triethylene glycoldimethacrylate, propylene glycoldimethacrylate, 1,4-butanedioldimethacrylate, and 1,6-hexanedioldimethacrylate.

The resin may be included in an amount of 1 wt % to 40 wt %, for example 5 wt % to 30 wt % based on the total amount (total weight) of the curable composition. When the resin is included within the foregoing ranges, patterns formed by inkjet printing of the same may exhibit improved reliability such as heat resistance, chemical resistance, film strengths, and physical characteristics.

(C') Solvent

When a curable composition includes a photo-conversion material such as a quantum dot and the like instead of a pigment or a dye as a color material, a solvent generally used for the curable composition, for example, a polar solvent such as propylene glycol monomethylether acetate, ethanol, ethylene diglycolmethylethylether, and the like is difficult to use. However, as described above, since the surface of a quantum dot is modified by the compound represented by Chemical Formula 1 or 2 according to an embodiment, the quantum dot may be used in the polar solvent, and furthermore, the deterioration problem of a photo-conversion rate of the quantum dot may be solved or reduced.

In other words, the curable composition according to an embodiment may use a solvent including the photosensitive composition.

The solvent may be included in a balance amount, for example 20 wt % to 80 wt %, for example 35 wt % to 80 wt % based on the total amount (total weight) of the curable composition. When the solvent is within the foregoing ranges, the curable composition has suitable or appropriate viscosity, and thus, may have excellent coating property when coated in a large area through spin-coating and slit-coating.

Diffusion Agent (or Diffusion Agent Dispersion)

The curable composition according to an embodiment may further include a diffusion agent. The diffusion agent is the same as described herein above.

Polymerization Initiator

The curable composition may further include a polymerization initiator in order to improve the strength or integrity of the resultant patterns.

The polymerization initiator may be a cation initiator. The cation initiator initiates a polymerization of the resin, and may be any suitable cation initiator available in the art, for example, sulfonium salts such as triallylsulfoniumhexafluorophosphate, triarylsulfoniumhexafluoroantimonate, and the like; iodonium salts such as diaryliodonium hexafluorophosphate, diphenyliodonium hexafluoroantimonate, bis(dodecylphenyl)iodonium tetrakis(pentafluorophenyl)borate, iodonium [4-(4-methylphenyl-2-methylpropyl)phenyl] hexafluorophosphate, and the like; phosphonium salts such as tetrafluorophosphonium hexafluorophosphate; pyridinium salts, and the like.

When the curable composition further includes the polymerization initiator, the polymerization initiator may be included in an amount of 0.01 parts by weight to 10 parts by weight, for example 0.05 parts by weight to 5 parts by weight based on 100 parts by weight of the curable composition. When the polymerization initiator is included in an amount of less than 0.01 parts by weight, a curing rate of the resin is so slow that strength improvement of patterns may be unsuitable or insufficient, while when it is greater than 10 parts by weight, the curing rate of the resin is so fast that storage stability may be unstable and viscosity may be continuously increased and thus discharge performance may be deteriorated.

Other Additives

The curable composition according to an embodiment may further include a polymerization inhibitor including a hydroquinone-based compound, a catechol-based compound, or a combination thereof. The curable composition according to an embodiment may inhibit or reduce cross-linking at room temperature during exposure after coating the curable composition by further including the hydroquinone-based compound, the catechol-based compound, or a combination thereof.

For example, the hydroquinone-based compound, the catechol-based compound, or the combination thereof may be hydroquinone, methyl hydroquinone, methoxyhydroquinone, t-butyl hydroquinone, 2,5-di-t-butyl hydroquinone, 2,5-bis(1,1-dimethylbutyl) hydroquinone, 2,5-bis (1,1,3,3-tetramethylbutyl) hydroquinone, catechol, t-butyl catechol, 4-methoxyphenol, pyrogallol, 2,6-di-t-butyl-4-methylphenol, 2-naphthol, tris(N-hydroxy-N-nitrosophenylaminato-O, O')aluminum, or a combination thereof, but are not limited thereto.

The hydroquinone-based compound, catechol-based compound or combination thereof may be used in a form of dispersion, and the polymerization inhibitor in a form of the dispersion may be included in an amount of 0.001 wt % to 1 wt %, for example 0.01 wt % to 0.1 wt % based on the total amount (total weight) of the curable composition. When the polymerization inhibitor is included within the foregoing ranges, passage of time at room temperature may be solved or reduced and concurrently (e.g., simultaneously), sensitivity deterioration and surface delamination phenomenon may be inhibited or reduced.

In addition, the curable composition according to an embodiment may further include malonic acid; 3-amino-1,2-propanediol; a silane-based coupling agent; a leveling agent; a fluorine-based surfactant; or a combination thereof in order to improve heat resistance and reliability.

For example, the curable composition may further include a silane-based coupling agent having a reactive substituent such as a vinyl group, a carboxyl group, a methacryloxy group, an isocyanate group, an epoxy group and the like in order to improve close contacting properties with a substrate.

Examples of the silane-based coupling agent may be trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(3,4-epoxycyclohexyl)ethyltrimethoxysilane, and the like, and these may be used alone or in a mixture of two or more.

The silane-based coupling agent may be used in an amount of 0.01 parts by weight to 10 parts by weight based on 100 parts by weight of the curable composition. When the silane-based coupling agent is included within the foregoing range, close contacting properties, storage capability, and the like are improved.

The curable composition may further include a surfactant, for example a fluorine-based surfactant as desired or needed in order to improve coating properties and inhibit or reduce generation of spots (e.g., improve leveling performance).

The fluorine-based surfactant may have a low weight average molecular weight of 4,000 g/mol to 10,000 g/mol, and, for example, 6,000 g/mol to 10,000 g/mol. In addition, the fluorine-based surfactant may have a surface tension of 18 mN/m to 23 mN/m (measured in a 0.1% polyethylene glycol monomethylether acetate (PGMEA) solution). When the fluorine-based surfactant has a weight average molecular weight and a surface tension within the foregoing ranges, leveling performance may be further improved, and excellent characteristics may be provided when slit coating as high speed coating is applied since film defects may be less generated by preventing (or reducing) a spot generation during the high speed coating and suppressing (or reducing) the generation of vapor.

Examples of the fluorine-based surfactant may be, BM-1000®, and BM-1100® (BM Chemie Inc.); MEGA-FACE F 142D®, F 172®, F 173®, and F 183® Dainippon Ink Kagaku Kogyo Co., Ltd.); FULORAD FC-135®, FULORAD FC-170C®, FULORAD FC-430®, and FULO-RAD FC-431® (Sumitomo 3M Co., Ltd.); SURFLON S-112®, SURFLON S-113®, SURFLON S-131®, SURF-LON S-141®, and SURFLON S-145® (ASAHI Glass Co., Ltd.); and SH-28PA®, SH-190®, SH-193®, SZ-6032®, and SF-8428®, and the like (Toray Silicone Co., Ltd.); F-482, F-484, F-478, F-554 and the like of DIC Co., Ltd.

The surfactant may further include a silicone-based surfactant in addition to the fluorine-based surfactant. Examples of the silicone-based surfactant may be TSF400, TSF401, TSF410, TSF4440, and the like of Toshiba silicone Co., Ltd., but is not limited thereto.

The surfactant may be included in an amount of 0.01 parts by weight to 5 parts by weight, for example 0.1 parts by weight to 2 parts by weight based on 100 parts by weight of the photosensitive composition. When the surfactant is included within the foregoing ranges, foreign materials are less produced after the development.

In addition, the curable composition according to an embodiment may further include other additives such as an antioxidant, a stabilizer, and the like in a set or predetermined amount, unless properties are deteriorated.

Another embodiment provides a photosensitive resin film manufactured using the photosensitive resin composition and a color filter including the photosensitive resin film. The color filter may be manufactured as follows.

(1) Coating and Film Formation

The photosensitive resin composition is coated to have a desired thickness, for example, a thickness in a range of 2 μm to 10 μm, on a substrate which undergoes a set or predetermined pretreatment, using a spin or slit coating method, a roll coating method, a screen-printing method, an applicator method, and the like. Then, the coated substrate is heated at a temperature in a range of 70° C. to 90° C. for 1 minute to 10 minutes to remove a solvent.

(2) Exposure

The resultant film is radiated by an active ray such as UV ray having a wavelength of 190 nm to 450 nm, for example 200 nm to 500 nm after putting a mask with a set or predetermined shape to form a desired pattern. The radiation is performed by using a light source such as a mercury lamp with a low pressure, a high pressure, or an ultrahigh pressure, a metal halide lamp, an argon gas laser, and the like. An X ray, an electron beam, and the like may be also used as desired or needed.

Exposure process uses, for example, a light dose of 500 $mJ/cm^2$ or less (with a 365 nm sensor) when a high pressure mercury lamp is used. However, the light dose may vary depending on kinds of each component of the black photosensitive resin composition, its combination ratio, and a dry film thickness.

(3) Development

After the exposure process, an alkali aqueous solution is used to develop the exposed film by dissolving and removing a set or unnecessary part except the exposed part, forming an image pattern. In other words, when the alkali developing solution is used for the development, a non-exposed region is dissolved, and an image color filter pattern is formed.

(4) Post-Treatment

The developed image pattern may be heated again or radiated by an active ray and the like for curing, in order to accomplish excellent quality in terms of heat resistance, photo resistance, close contacting properties, crack-resistance, chemical resistance, high strength, storage stability, and the like.

Another embodiment provides a method of manufacturing a pixel for a color filter using the curable composition and a color filter including the pixel manufactured with the manufacturing method.

The method of manufacturing the pixel for the color filter may include coating the curable composition on a substrate with an inkjet spraying method to form a pattern (S1); and curing the pattern (S2).

(S1) Formation of Pattern

The curable composition may be coated to be 0.5 to 3.0 μm thick on a substrate utilizing an inkjet spraying method. The inkjet spraying method may form a pattern by spraying a single color, and thus, repeating the spraying as many times as the desired or needed number of colors, but the pattern may be formed by concurrently (e.g., simultaneously) spraying the desired or needed number of colors.

(S2) Curing

The obtained pattern is cured to obtain a pixel. Herein, the curing may be thermal curing. The thermal curing may be performed at a temperature greater than or equal to 160° C., for example, in a range of 160° C. to 300° C., or in a range of 200° C. to 250° C.

Another embodiment provides a method of manufacturing the surface-modified quantum dot. The method of manufacturing the surface-modified quantum dot includes dispersing quantum dots surface-modified with oleic acid in a nonpolar solvent; adding a compound having a thiol group at one terminal end and an alkoxy group, a cycloalkyl group, a carboxyl group, or a hydroxy group at the other terminal end, and a metal salt thereto and stirring the same; and being subject to centrifugation of the stirred solution (e.g., centrifuging the stirred solution) to separate a supernatant and lower liquid followed by drying the lower liquid.

When the surface of the quantum dot having a core/shell structure includes (or consists of) a bond of a metal cation and anion or an atom having a δ(−) charge (e.g., Zn and S as for a CdSe/ZnS quantum dot), an atom including (or consisting of) an outermost layer forms a dangling bond due to electrons/holes not participated in the bonding. This dangling bond works as a quenching site of excited electrons and thus mainly deteriorates luminous efficiency. Herein, when the surface of the quantum dot is capped with an anion or a cation, a deep/shallow trap state of a bandgap is effectively passivated, and resultantly, the luminous efficiency deterioration may be reduced.

In other words, a cation in the metal salt compound is coordinated with an atom including (or consisting of) an outermost layer of the quantum dot (a primary metal ion passivation), and thus, may induce or deduce passivation of a thiol-based ligand in a more amount (a secondary thiol ligand passivation). Herein, before the coordination bond of the cation in the metal salt compound, the outermost layer of the quantum dot has been already passivated by the thiol-based ligand.

The metal salt compound may include a zinc cation, an indium cation, a lead cation, a cadmium cation, or a combination thereof.

For example, the metal salt compound may be $ZnCl_2$ or $InCl_3$.

In addition, the stirring may be performed at a temperature of 60° C. to 70° C. When the stirring is performed at 60° C. to 70° C. rather than when the stirring is performed at room temperature of 20° C., a ligand exchange reaction (substituting a thiol-based ligand for an oleic acid ligand) rate is constantly (or substantially constantly) maintained regardless of an amount of the salt compound, and thus, excellent patternability may be obtained.

The surface-modified quantum dot is the same as described above.

The quantum dot powder manufactured by embodiments of the method may be dispersed in a polar solvent such as PGMEA and the like to prepare the photosensitive resin composition.

Hereinafter, embodiments of the present disclosure are illustrated in more detail with reference to examples. These examples, however, are not in any sense to be interpreted as limiting the scope of the present disclosure.

(Preparation of Quantum Dot Dispersion Solution)

Preparation Example 1

0.33 g of a compound represented by Chemical Formula 1-1 and 23.3 mg of $ZnCl_2$ were added to 3.33 g of an InP/ZeSe/ZnS-oleate ligand quantum dot solution dispersed in cyclohexane (fluorescence $\lambda_{em}$=542 nm, FWHM=37 nm, Green QD, Hansol Chemical Co., Ltd.) (a solid content: 30%), and the mixture was stirred at room temperature (20° C.) for 12 hours. After 12 hours, the resultant was chemically precipitated by using a centrifuge (7000 rpm, 10 min) to separate and remove an upper solution therefrom. The rest thereof was dried by using a vacuum oven at room temperature (20° C.) for 3 hours to separate quantum dot powder ligand-exchanged with a compound represented by Chemical Formula 1-1 and dispersed in 2.33 g of PGMEA to prepare a quantum dot dispersion solution having a solid content of 30%.

Chemical Formula 1-1

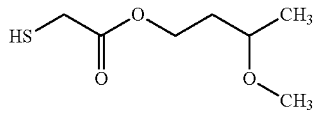

Preparation Example 2

A quantum dot dispersion solution having a solid content of 30% was prepared according to substantially the same method as Preparation Example 1 except for using $ZnCl_2$ in an amount of 11.65 mg instead of 23.3 mg.

Preparation Example 3

A quantum dot dispersion solution having a solid content of 30% was prepared according to substantially the same method as Preparation Example 1 except for using $ZnCl_2$ in an amount of 5.82 mg instead of 23.3 mg.

Preparation Example 4

A quantum dot dispersion solution having a solid content of 30% was prepared according to substantially the same method as Preparation Example 1 except for using $ZnCl_2$ in an amount of 2.91 mg instead of 23.3 mg.

Preparation Example 5

A quantum dot dispersion solution having a solid content of 30% was prepared according to substantially the same method as Preparation Example 1 except for not using $ZnCl_2$.

Preparation Example 6

A quantum dot dispersion solution having a solid content of 30% was prepared according to substantially the same method as Preparation Example 5 except for using a compound represented by Chemical Formula 1-2 instead of the compound represented by Chemical Formula 1-1.

Chemical Formula 1-2

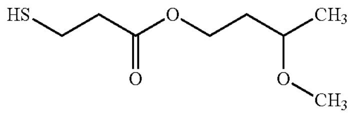

Preparation Example 1-1

A quantum dot dispersion solution having a solid content of 30% was prepared according to substantially the same method as Preparation Example 1 except for changing the temperature for the stirring from room temperature to 65° C.

Preparation Example 2-1

A quantum dot dispersion solution having a solid content of 30% was prepared according to substantially the same method as Preparation Example 2 except for changing the temperature for the stirring from room temperature to 65° C.

Preparation Example 3-1

A quantum dot dispersion solution having a solid content of 30% was prepared according to substantially the same method as Preparation Example 3 except for changing the temperature for the stirring from room temperature to 65° C.

Preparation Example 4-1

A quantum dot dispersion solution having a solid content of 30% was prepared according to substantially the same method as Preparation Example 4 except for changing the temperature for the stirring from room temperature to 65° C.

Preparation Example 5-1

A quantum dot dispersion solution having a solid content of 30% was prepared according to substantially the same method as Preparation Example 5 except for changing the temperature for the stirring from room temperature to 65° C.

Preparation Example 6-1

A quantum dot dispersion solution having a solid content of 30% was prepared according to substantially the same method as Preparation Example 6 except for changing the temperature for the stirring from room temperature to 65° C.

Preparation Example 7

A quantum dot dispersion solution having a solid content of 30% was prepared according to substantially the same method as Preparation Example 1-1 except for using a compound represented by Chemical Formula 1-2 instead of the compound represented by Chemical Formula 1-1.

Preparation Example 8

A quantum dot dispersion solution having a solid content of 30% was prepared according to substantially the same method as Preparation Example 1-1 except for using a compound represented by Chemical Formula 1-7 instead of the compound represented by Chemical Formula 1-1.

Chemical Formula 1-7

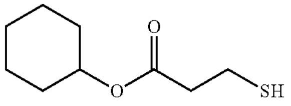

Preparation Example 9

A quantum dot dispersion solution having a solid content of 30% was prepared according to substantially the same method as Preparation Example 1-1 except for using a compound represented by Chemical Formula A-4 instead of the compound represented by Chemical Formula 1-1.

Chemical Formula 1-11

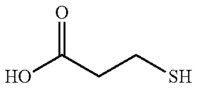

Preparation Example 10

A quantum dot dispersion solution having a solid content of 30% was prepared according to substantially the same method as Preparation Example 1-1 except for using a compound represented by Chemical Formula 1-3 instead of the compound represented by Chemical Formula 1-1.

Chemical Formula 1-3

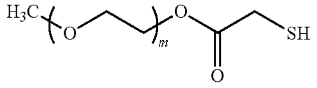

(in Chemical Formula 1-3, m is an integer of 3.)

Preparation Example 11

A quantum dot dispersion solution having a solid content of 30% was prepared according to substantially the same method as Preparation Example 1-1 except for using a compound represented by Chemical Formula 1-6 instead of the compound represented by Chemical Formula 1-1.

Chemical Formula 1-6

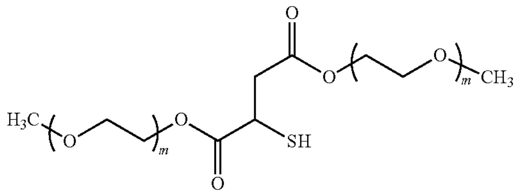

(in Chemical Formula 1-6, m is an integer of 3.)

Preparation Example 12

A quantum dot dispersion solution having a solid content of 30% was prepared according to substantially the same method as Preparation Example 1-1 except for using a compound represented by Chemical Formula 1-4 instead of the compound represented by Chemical Formula 1-1.

Chemical Formula 1-4

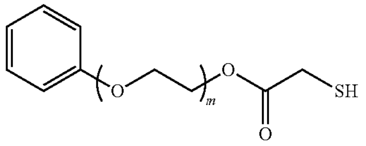

(in Chemical Formula 1-4, m is an integer of 3.)

Preparation Example 13

A quantum dot dispersion solution having a solid content of 30% was prepared according to substantially the same method as Preparation Example 1-1 except for using a compound represented by Chemical Formula 1-5 instead of the compound represented by Chemical Formula 1-1.

Chemical Formula 1-5

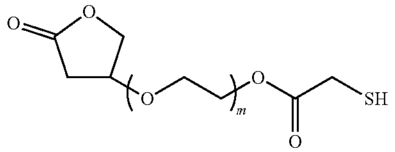

Preparation Example 14

A quantum dot dispersion solution having a solid content of 30% was prepared according to substantially the same method as Preparation Example 1-1 except for using a compound represented by Chemical Formula 2-1 instead of the compound represented by Chemical Formula 1-1.

Chemical Formula 2-1

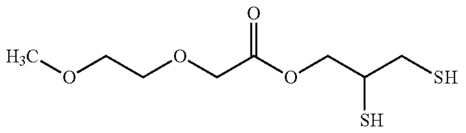

Comparative Preparation Example 1

A quantum dot dispersion solution having a solid content of 30% was prepared according to substantially the same method as Preparation Example 1 except for using cyclohexylacetate instead of PGMEA.

Comparative Preparation Example 2

A quantum dot dispersion solution having a solid content of 30% was prepared according to substantially the same method as Preparation Example 1-1 except for using PE-TSA represented by the following chemical formula instead of the compound represented by Chemical Formula 1-1.

PE-TSA

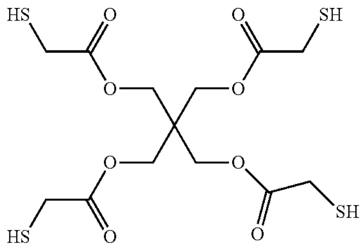

Comparative Preparation Example 3

A quantum dot dispersion solution having a solid content of 30% was prepared according to substantially the same method as Preparation Example 1-1 except for using PE-TSA represented by Chemical Formula C-1 instead of the compound represented by Chemical Formula 1-1.

Chemical Formula C-1

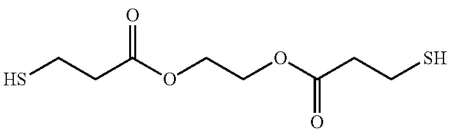

Comparative Preparation Example 4

A quantum dot dispersion solution having a solid content of 30% was prepared according to substantially the same method as Preparation Example 1-1 except for using PE-TSA represented by Chemical Formula C-2 instead of the compound represented by Chemical Formula 1-1.

Chemical Formula C-2

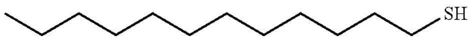

Evaluation 1: Dispersibility

A particle size of quantum dots in each quantum dot dispersion solution according to Preparation Example 1 and Comparative Preparation Example 1 was respectively three times measured by a particle size analyzer, and the results are shown in Table 1.

TABLE 1

| | Preparation Example 1 | Comparative Preparation Example 1 |
|---|---|---|
| Particle size (nm) | 15.8 | 16.0 |

Referring to Table 1, the particle diameter of quantum dots in the dispersion solutions according to Preparation Example 1 and Comparative Preparation Example 1 were substantially the same (approximately 16 nm), and accordingly, the quantum dots surface-modified with the compound represented by Chemical Formula 1-1 turned out to have substantially equivalent dispersibility to an existing level in a polar solvent such as PGMEA.

Evaluation 2: Patternability

Figure 2:
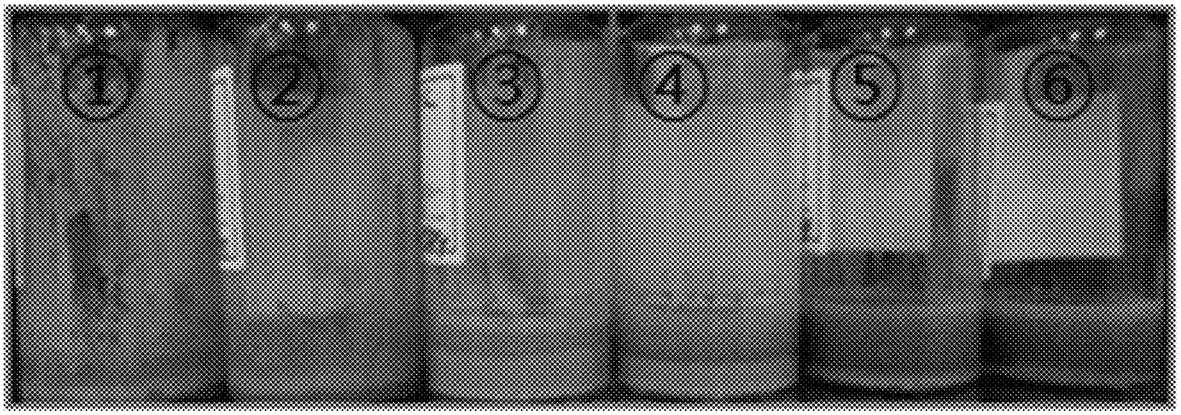
FIG. 2 is an image of a stirred solution after stirring a compound for surface-modifying a quantum dot (a compound having a thiol group at one terminal end and an alkoxy group, a cycloalkyl group, a carboxyl group, or a hydroxy group at the other terminal end) and a metal salt in quantum dots surface-modified with oleic acid and a nonpolar solvent for 12 hours at 65° C.

The dispersion solutions according to Preparation Examples 1 to 6 respectively correspond to ① to ⑥ of FIG. 1, the dispersion solutions according to Preparation Examples 1-1 to 6-1 respectively correspond to ① to ⑥ of FIG. 2, and referring to FIGS. 1-2, as a smaller amount of $ZnCl_2$ was dispersed at room temperature, a ligand exchange reaction rate became slower, but when $ZnCl_2$ was dispersed at 65° C., a chemical precipitate was separated at a constant rate regardless of the amount of $ZnCl_2$, and accordingly, 65° C. turned out to be suitable for patternability to room temperature as a temperature for dispersion. In addition, Zn of $ZnCl_2$ turned out to function as a catalyst in the ligand exchange reaction.

(Preparation of Photosensitive Composition)

Each photosensitive resin composition according to Examples 1 to 9 and Comparative Examples 1 to 4 was prepared to have a composition shown in Tables 2 and 3 by using the following components.

A photopolymerization initiator was dissolved in a solvent, and the solution is suitably or sufficiently stirred at room temperature for 2 hours. Subsequently, an acryl-based binder resin along with the quantum dots (Preparation Example 1 and Comparative Preparation Example 1) and a dispersing agent (TEGO D685 made by EVONIK) was added thereto, and the obtained mixture was stirred again at room temperature for 2 hours. Then, a diffusion agent and a fluorine-based surfactant were added thereto, a mixture obtained therefrom was stirred at room temperature for one hour, and a product therefrom was three times filtered to remove impurities to prepare photosensitive resin compositions. (The dispersing agent is added in an amount of 15 wt % relative to a solid content of the quantum dots)

(A) Binder Resin

Acryl-based binder resin (TB04, TACOMA)

(B) Photopolymerizable Monomer

Tricyclodecane dimethanol diacrylate (TCI)

(C) Photopolymerization Initiator

PBG 305 (Tronly)

Quantum Dot (D-1) Quantum dot dispersion solution of Preparation Example 1

(D-2) Quantum dot dispersion solution of Preparation Example 7

(D-3) Quantum dot dispersion solution of Preparation Example 8

(D-4) Quantum dot dispersion solution of Preparation Example 9

(D-5) Quantum dot dispersion solution of Preparation Example 10

(D-6) Quantum dot dispersion solution of Preparation Example 11

(D-7) Quantum dot dispersion solution of Preparation Example 12

(D-8) Quantum dot dispersion solution of Preparation Example 13

(D-9) Quantum dot dispersion solution of Preparation Example 14

(D-10) Quantum dot dispersion solution of Comparative Preparation Example 1

(D-11) Quantum dot dispersion solution of Comparative Preparation Example 2

(D-12) Quantum dot dispersion solution of Comparative Preparation Example 3

(D-13) Quantum dot dispersion solution of Comparative Preparation Example 4

(E) Solvent

Propylene Glycol Monomethylether Acetate (PGMEA, Sigma-Aldrich Corporation)

(F) Diffusion Agent

Titanium dioxide dispersion ($TiO_2$ solid: 20 wt %, Average particle diameter: 200 nm, Ditto Technology)

(G) Other Additives

Leveling agent (F-554, DIG Go., Ltd.)

TABLE 2

(unit: wt %)

| | | Example 1 | Example 2 | Example 3 | Example 4 | Example 5 | Example 6 | Example 7 |
|---|---|---|---|---|---|---|---|---|
| (A) Binder resin | | 9.8 | 9.8 | 9.8 | 9.8 | 9.8 | 9.8 | 9.8 |
| (B) Photopolymerizable monomer | | 1.6 | 1.6 | 1.6 | 1.6 | 1.6 | 1.6 | 1.6 |
| (C) Photopolymerization initiator | | 0.1 | 0.1 | 0.1 | 0.1 | 0.1 | 0.1 | 0.1 |
| (D) Quantum | D-1 | 13 | — | — | — | — | — | — |
| dot | D-2 | — | 13 | — | — | — | — | — |
| | D-3 | — | — | 13 | — | — | — | — |
| | D-4 | — | — | — | 13 | — | — | — |
| | D-5 | — | — | — | — | 13 | — | — |
| | D-6 | — | — | — | — | — | 13 | — |
| | D-7 | — | — | — | — | — | — | 13 |
| (F) Solvent | | 60.4 | 60.4 | 60.4 | 60.4 | 60.4 | 60.4 | 60.4 |
| (F) Diffusion agent | | 12.6 | 12.6 | 12.6 | 12.6 | 12.6 | 12.6 | 12.6 |
| (G) Other additive | | 2.5 | 2.5 | 2.5 | 2.5 | 2.5 | 2.5 | 2.5 |

TABLE 3

(unit: wt %)

| | | Example 8 | Example 9 | Comparative Example 1 | Comparative Example 2 | Comparative Example 3 | Comparative Example 4 |
|---|---|---|---|---|---|---|---|
| (A) Binder resin | | 9.8 | 9.8 | 9.8 | 9.8 | 9.8 | 9.8 |
| (B) Photopolymerizable monomer | | 1.6 | 1.6 | 1.6 | 1.6 | 1.6 | 1.6 |
| (C) Photopolymerization initiator | | 0.1 | 0.1 | 0.1 | 0.1 | 0.1 | 0.1 |
| (D) Quantum | D-8 | 13 | — | — | — | — | — |
| dot | D-9 | — | 13 | — | — | — | — |
| | D-10 | — | — | 13 | — | — | — |
| | D-11 | — | — | — | 13 | — | — |
| | D-12 | — | — | — | — | 13 | — |
| | D-13 | — | — | — | — | — | 13 |
| (F) Solvent | | 60.4 | 60.4 | 60.4 | 60.4 | 60.4 | 60.4 |
| (F) Diffusion agent | | 12.6 | 12.6 | 12.6 | 12.6 | 12.6 | 12.6 |
| (G) Other additives | | 2.5 | 2.5 | 2.5 | 2.5 | 2.5 | 2.5 |

Evaluation 3: Photo-Conversion Rate and Photo Maintenance Rate of Quantum Dot

The photosensitive resin compositions according to Examples 1 to 9 and Comparative Examples 1 to 4 were respectively coated into a 5 μm-thick single film on a glass substrate by using a spin-coater (150 rpm, Opticoat MS-A150, Mikasa Co., Ltd.) and pre-baked (PRB) on a hot-plate at 100° C. for 1 minute, and their initial blue photo-conversion rates were measured.

Then, the coated photosensitive resin compositions were radiated by UV with an exposer (Ghi broadband, Ushio Inc.) with an output (power) of 60 $mJ/cm^2$ to 100 $mJ/cm^2$ and post-baked (POB) in a convection clean oven (Jongro Co., Ltd.) at 180° C. for 30 minutes, and their blue photo-conversion rates were measured.

As for the pre-baking and the post-baking, a photo-conversion rate from blue light entering from BLU into green light and a photo maintenance rate were evaluated, and the results are shown in Table 4. Herein, the blue photo-conversion rate (green/blue) was measured by using a CAS 140 CT spectrometer equipment and specifically, by putting a bare glass on the blue BLU (455 nm) covered with a diffusing film to first get a reference measured with a detector and then, putting the single films obtained by respectively coating the photosensitive resin compositions according to Examples 1 to 9 and Comparative Examples 1 to 4 and measuring a blue-to-green converted peak increase amount relative to a blue absorption peak decrease amount. In addition, the photo maintenance rate was also evaluated by measuring how much a photo-conversion rate of the initial PRB step was maintained in the POB step (e.g., by measuring how much the photo-conversion rate was maintained from the PRB step to the POB step).

(B'-4) Quantum dot dispersion solution of Preparation Example 9

(B'-5) Quantum dot dispersion solution of Preparation Example 10

(B'-6) Quantum dot dispersion solution of Preparation Example 11

(B'-7) Quantum dot dispersion solution of Preparation Example 12

(B'-8) Quantum dot dispersion solution of Preparation Example 13

(B'-9) Quantum dot dispersion solution of Preparation Example 14

(B'-10) Quantum dot dispersion solution of Comparative Preparation Example 1

(B'-11) Quantum dot dispersion solution of Comparative Preparation Example 2

(B'-12) Quantum dot dispersion solution of Comparative Preparation Example 3

(B'-13) Quantum dot dispersion solution of Comparative Preparation Example 4

(C') Solvent

Propylene glycol monomethylether acetate (PGMEA, Sigma-Aldrich Corporation)

(D') Diffusion Agent

Titanium dioxide dispersion ($TiO_2$ solid: 20 wt %, Average particle diameter: 200 nm, Ditto Technology)

(E') Polymerization Initiator

Thermal polymerization initiator (SAN-AID SI-60, SANSHIN)

(F') Other Additives

Leveling agent (F-554, DIC Co., Ltd.)

TABLE 4

| | Ex. 1 | Ex. 2 | Ex. 3 | Ex. 4 | Ex. 5 | Ex. 6 | Ex. 7 | Ex. 8 | Ex. 9 | Comp. Ex. 1 | Comp. Ex. 2 | Comp. Ex. 3 | Comp. Ex. 4 |
|---|---|---|---|---|---|---|---|---|---|---|---|---|---|
| Photo-conversion rate (%) | 23 | 23 | 21 | 20 | 22 | 21 | 23 | 22 | 23 | 17 | 16 | 16 | 15 |
| Photo Maintenance Rate (%) | 95 | 95 | 94 | 93 | 95 | 93 | 94 | 95 | 95 | 77 | 80 | 81 | 80 |

As shown in Table 4, the photosensitive resin compositions according to Examples 1 to 9 showed a small decrease of blue photo-conversion rate and a high photo maintenance rate during the color filter process as compared with the photosensitive resin compositions according to Comparative Examples 1 to 4.

(Preparation of Curable Composition)

Each curable composition according to Examples 10 to 18 and Comparative Examples 5 to 8 was prepared to have a composition shown in Tables 5 and 6 by using components mentioned therein.

(A') Resin (A'-1) Binder Resin

Acryl-based resin (TB04, TACOMA)

(A'-2) Reactive unsaturated compound

Tricyclodecane dimethanol diacrylate (TCI)

(B') Quantum Dot (B'-1) Quantum dot dispersion solution of Preparation Example 1

(B'-2) Quantum dot dispersion solution of Preparation Example 7

(B'-3) Quantum dot dispersion solution of Preparation Example 8

TABLE 5

(unit: wt %)

| | | Ex. 10 | Ex. 11 | Ex. 12 | Ex. 13 | Ex. 14 | Ex. 15 |
|---|---|---|---|---|---|---|---|
| Binder resin | | 9.8 | 9.8 | 9.8 | 9.8 | 9.8 | 9.8 |
| Reactive unsaturated monomer | | 1.6 | 1.6 | 1.6 | 1.6 | 1.6 | 1.6 |
| Polymerization initiator | | 0.1 | 0.1 | 0.1 | 0.1 | 0.1 | 0.1 |
| Quantum dot | B'-1 | 13 | — | — | — | — | — |
| | B'-2 | — | 13 | — | — | — | — |
| | B'-3 | — | — | 13 | — | — | — |
| | B'-4 | — | — | — | 13 | — | — |
| | B'-5 | — | — | — | — | 13 | — |
| | B'-6 | — | — | — | — | — | 13 |
| Solvent | | 60.4 | 60.4 | 60.4 | 60.4 | 60.4 | 60.4 |
| Diffusion agent | | 12.6 | 12.6 | 12.6 | 12.6 | 12.6 | 12.6 |
| Other additives | | 2.5 | 2.5 | 2.5 | 2.5 | 2.5 | 2.5 |

TABLE 6

| (unit: wt %) | | Ex. 16 | Ex. 17 | Ex. 18 | Comp. Ex. 5 | Comp. Ex. 6 | Comp. Ex. 7 | Comp. Ex. 8 |
|---|---|---|---|---|---|---|---|---|
| Binder resin | | 9.8 | 9.8 | 9.8 | 9.8 | 9.8 | 9.8 | 9.8 |
| Reactive unsaturated monomer | | 1.6 | 1.6 | 1.6 | 1.6 | 1.6 | 1.6 | 1.6 |
| Thermal polymerization initiator | | 0.1 | 0.1 | 0.1 | 0.1 | 0.1 | 0.1 | 0.1 |
| Quantum | B'-7 | 13 | — | — | — | — | — | — |
| dot | B'-8 | — | 13 | — | — | — | — | — |
| | B'-9 | — | — | 13 | — | — | — | — |
| | B'-10 | — | — | — | 13 | — | — | — |
| | B'-11 | — | — | — | — | 13 | — | — |
| | B'-12 | — | — | — | — | — | 13 | — |
| | B'-13 | — | — | — | — | — | — | 13 |
| Solvent | | 60.4 | 60.4 | 60.4 | 60.4 | 60.4 | 60.4 | 60.4 |
| Diffusion agent | | 12.6 | 12.6 | 12.6 | 12.6 | 12.6 | 12.6 | 12.6 |
| Other additives | | 2.5 | 2.5 | 2.5 | 2.5 | 2.5 | 2.5 | 2.5 |

Evaluation 4: Photo-Conversion Rate and Photo-Maintenance Rate of Quantum Dot

The curable compositions according to Examples 10 to 18 and Comparative Examples 5 to 8 were respectively coated into a 1 μm to 2 μm-thick film on a glass substrate by using a spin-coater (150 rpm, Opticoat MS-A150, Mikasa Co., Ltd.), dried at 80° C. for 1 minute on a hot-plate to obtain films, and their initial blue photo-conversion rates were measured (a first step).

The obtained films were dried in a forced convection drying furnace at 220° C. for 40 minutes, and their blue photo-conversion rates were measured (a second step).

Regarding the first and second steps, a photo-conversion rate from incident blue light from BLU to green light and a photo-maintenance rate were evaluated, and the results are shown in Tables 7 and 8. Herein, the blue photo-conversion rate (green/blue) was obtained by using a CAS 140 CT spectrometer and specifically, by putting a bare glass on the blue BLU (455 nm) covered with a diffusing film and first measuring a reference with a detector and then, putting the single films obtained by respectively coating the curable compositions according to Examples 9 to 18 and Comparative Examples 5 to 8 and measuring a blue-to-green converted peak increase amount relative to a blue absorption peak decrease amount. In addition, the photo-maintenance rate from the first step to the second step (e.g., how long the photo-conversion rate in the first step was maintained in the second step) was measured.

TABLE 7

| | Ex. 10 | Ex. 11 | Ex. 12 | Ex. 13 | Ex. 14 | Ex. 15 | Ex. 16 |
|---|---|---|---|---|---|---|---|
| Photo-conversion rate (%) | 23 | 23 | 21 | 20 | 22 | 21 | 23 |
| Photo-maintenance rate (%) | 95 | 95 | 94 | 93 | 95 | 93 | 96 |

TABLE 8

| | Ex. 17 | Ex. 18 | Comp. Ex. 5 | Comp. Ex. 6 | Comp. Ex. 7 | Comp. Ex. 8 |
|---|---|---|---|---|---|---|
| Photo-conversion rate (%) | 23 | 22 | 17 | 16 | 16 | 15 |
| Photo-maintenance rate (%) | 95 | 94 | 77 | 80 | 81 | 80 |

As shown in Tables 7 and 8, the curable compositions according to Examples 10 to 18 showed a small blue photo-conversion rate deterioration and a high photo-maintenance rate as compared with the curable compositions according to Comparative Examples 5 to 8, as a color filter process proceeded.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While the subject matter of the present disclosure has been described in connection with what is presently considered to be practical example embodiments, it is to be understood that the present disclosure is not limited to the disclosed embodiments, but, on the contrary, is intended to cover various modifications and equivalent arrangements included within the spirit and scope of the appended claims, and equivalents thereof. Therefore, the aforementioned embodiments should be understood to be exemplary and not limiting the present disclosure in any way.

What is claimed is:

1. A photosensitive composition, comprising:

(A) a binder resin;

(B) a photopolymerizable monomer;

(C) a photopolymerization initiator;

(D) a quantum dot surface-modified with a first compound having a thiol group at one terminal end or at the middle of a main chain and having an alkoxy group, a cycloalkyl group, a carboxyl group, or a hydroxy group at the other terminal end or a second compound having each thiol group at one terminal end and at the middle of the main chain and having an alkoxy group, a cycloalkyl group, a carboxyl group, or a hydroxy group at the other terminal end;

(E) a solvent; and (F) a diffusion agent.

2. The photosensitive composition of claim 1, wherein the alkoxy group is a C1 to C10 alkoxy group and the cycloalkyl group is a C3 to C10 cycloalkyl group.

3. The photosensitive composition of claim 1, wherein the first compound and second compound each independently comprises an ester group.

4. The photosensitive composition of claim 1, wherein the surface-modified quantum dot has a core-shell structure wherein the shell comprises Zn, and the thiol group at the terminal end of the compound represented by Chemical Formula 1 or Chemical Formula 2 is bonded with Zn of the shell.

5. The photosensitive composition of claim 1, wherein the quantum dot has a maximum fluorescence wavelength in a wavelength range of 500 nm to 680 nm.

6. The photosensitive composition of claim 1, wherein the solvent comprises propylene glycol monomethylether acetate, dipropylene glycol methylether acetate, ethanol, ethylene glycoldimethylether, ethylene diglycolmethylethylether, diethylene glycoldimethylether, 2-butoxyethanol, N-methylpyrrolidine, N-ethylpyrrolidine, propylene carbonate, γ-butyrolactone, or a combination thereof.

7. The photosensitive composition of claim 1, wherein the binder resin comprises an acryl-based binder resin, a cardo-based binder resin, or a combination thereof.

8. The photosensitive composition of claim 1, wherein the diffusion agent is included in an amount of 0.1 wt % to 20 wt % based on the total amount of the photosensitive composition.

9. The photosensitive composition of claim 1, wherein the diffusion agent comprises barium sulfate, calcium carbonate, titanium dioxide, zirconia, or a combination thereof.

10. The photosensitive composition of claim 1, wherein the photosensitive composition comprises 1 wt % to 30 wt % of the (A) binder resin; 0.1 wt % to 30 wt % of the (B) photopolymerizable monomer; 0.1 wt % to 10 wt % of the (C) photopolymerization initiator; 1 wt % to 40 wt % of the (D) surface-modified quantum dot; and a balance amount of the (E) solvent based on the total amount of the photosensitive composition.

11. The photosensitive composition of claim 1, wherein the photosensitive composition further comprises malonic acid; 3-amino-1,2-propanediol; a silane-based coupling agent; a leveling agent; a fluorine-based surfactant; a polymerization inhibitor; or a combination thereof.

12. A photosensitive composition, comprising:

(A) a binder resin;

(B) a photopolymerizable monomer;

(C) a photopolymerization initiator;

(D) a quantum dot surface-modified with a first compound or a second compound;

(E) a solvent; and (F) a diffusion agent, wherein the first compound is represented by Chemical Formula 1 and the second compound is represented by Chemical Formula 2:

Chemical Formula 1

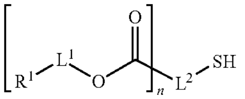

Chemical Formula 2

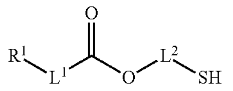

wherein, in Chemical Formula 1 and Chemical Formula 2, $R^1$ is a substituted or unsubstituted C1 to C20 alkyl group, a substituted or unsubstituted C1 to C20 alkoxy group, a substituted or unsubstituted C3 to C20 cycloalkyl group, a substituted or unsubstituted C6 to C20 aryl group, or a substituted or unsubstituted lactone ring, $L^1$ and $L^2$ are independently a single bond, a substituted or unsubstituted C1 to C20 alkylene group, a substituted or unsubstituted C1 to C20 oxyalkylene group, or a combination thereof, and n is an integer of 1 or 2.

13. The photosensitive composition of claim 12, wherein the lactone ring is a 5-membered ring or a 6-membered ring.

14. The photosensitive composition of claim 12, wherein in Chemical Formula 2, $L^2$ is a C1 to C20 alkylene group substituted with a thiol group.

15. The photosensitive composition of claim 12, wherein the substituted or unsubstituted C1 to C20 oxyalkylene group is a substituted or unsubstituted oxymethylene group, a substituted or unsubstituted oxyethylene group, or a combination thereof.

16. A photosensitive composition, comprising:

(A) a binder resin;

(B) a photopolymerizable monomer;

(C) a photopolymerization initiator;

(D) a quantum dot surface-modified with a first compound or a second compound;

(E) a solvent; and (F) a diffusion agent, wherein the first compound is represented by one of Chemical Formula 1-1 to Chemical Formula 1-7 and the second compound is represented by Chemical Formula 2-1:

Chemical Formula 1-1

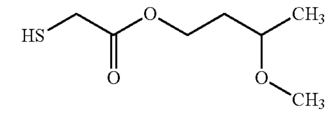

Chemical Formula 1-2

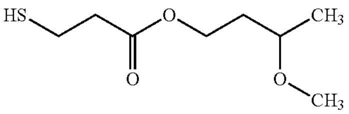

-continued

Chemical Formula 1-3

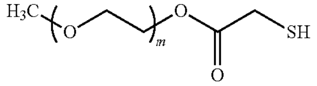

Chemical Formula 1-4

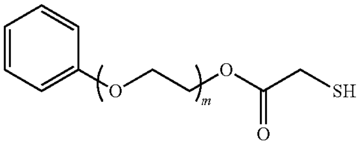

Chemical Formula 1-5

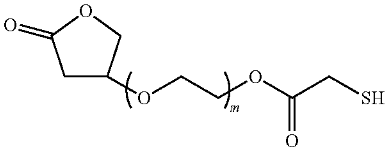

Chemical Formula 1-6

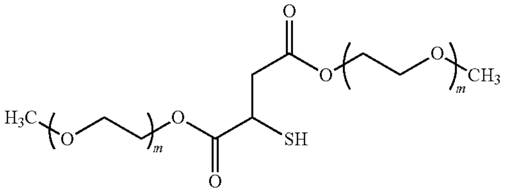

in Chemical Formula 1-3 to Chemical Formula 1-6, m is an integer of 1 to 5,

Chemical Formula 1-7

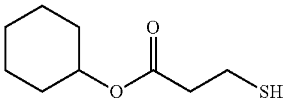

Chemical Formula 2-1

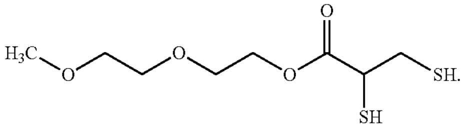

17. A color filter manufactured by using the photosensitive composition of claim 1.

* * * * *